United States Patent
Kikuchi et al.

(10) Patent No.: US 6,590,355 B1
(45) Date of Patent: Jul. 8, 2003

(54) LINEAR MOTOR DEVICE, STAGE DEVICE, AND EXPOSURE APPARATUS

(75) Inventors: Toshihide Kikuchi, Tokyo (JP); Masahiro Totsu, Kawasaki (JP); Kazuya Ono, San Carlos, CA (US); Yutaka Uda, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/588,713

(22) Filed: Jun. 7, 2000

(30) Foreign Application Priority Data

Jun. 7, 1999 (JP) .......................... 11-159247
Oct. 12, 1999 (JP) .......................... 11-290254

(51) Int. Cl.[7] ............................................. H02K 41/02
(52) U.S. Cl. ........................................ 318/135; 310/12
(58) Field of Search ..................... 310/12, 13; 318/135

(56) References Cited

U.S. PATENT DOCUMENTS

| | | | | |
|---|---|---|---|---|
| 3,912,991 A | * | 10/1975 | Moyse | 318/135 |
| 4,361,095 A | * | 11/1982 | Gibson | 318/135 |
| 4,454,457 A | * | 6/1984 | Nakamura et al. | 318/135 |
| 4,460,855 A | * | 7/1984 | Kelly | 318/135 |
| 4,595,870 A | * | 6/1986 | Chitayat | 318/135 |
| 4,760,294 A | * | 7/1988 | Hansen | 310/13 |
| 4,955,303 A | * | 9/1990 | Ikeda | 318/135 |
| 4,973,892 A | * | 11/1990 | Murata et al. | 310/12 |
| 5,136,217 A | * | 8/1992 | Hoffmann et al. | 318/135 |
| 5,973,459 A | * | 10/1999 | Itoh | 318/135 |
| 5,977,664 A | * | 11/1999 | Chitayat | 310/12 |
| 6,037,680 A | * | 3/2000 | Korenaga et al. | 310/12 |
| 6,107,703 A | * | 8/2000 | Korenaga | 310/12 |
| 6,226,073 B1 | * | 5/2001 | Emoto | 310/12 |
| 6,252,314 B1 | * | 6/2001 | Ebinuma | 310/12 |

* cited by examiner

*Primary Examiner*—Burton S. Mullins
(74) *Attorney, Agent, or Firm*—Oblon, Spivak, McClelland, Maier & Neustadt, P.C.

(57) ABSTRACT

Disclosed is a linear motor device provided with a movable member, a stator having coils, and a control system for powering selected coils among the coils in accordance with a position of the movable member. The control system powers only the minimum number of coils contributing to the generation of thrust in relation with the current position of the movable member.

20 Claims, 27 Drawing Sheets

FIG. 3A
FIG. 3B
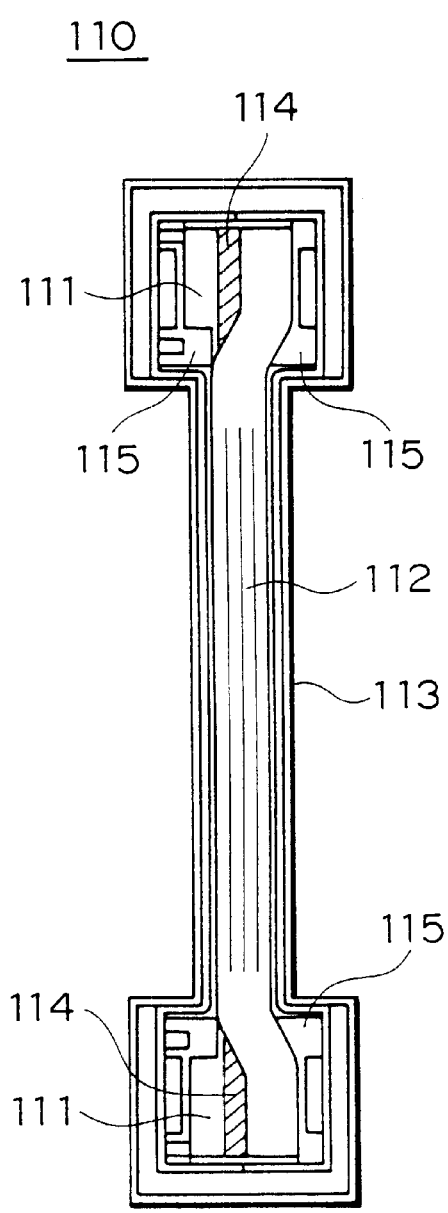
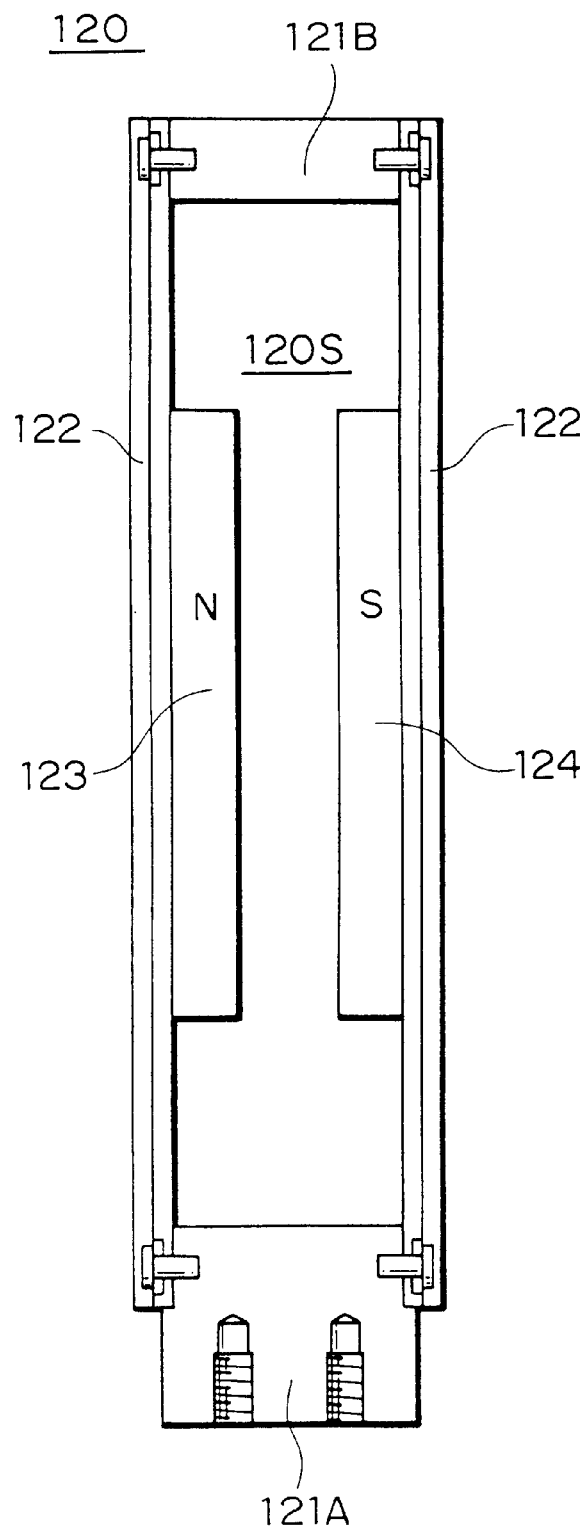

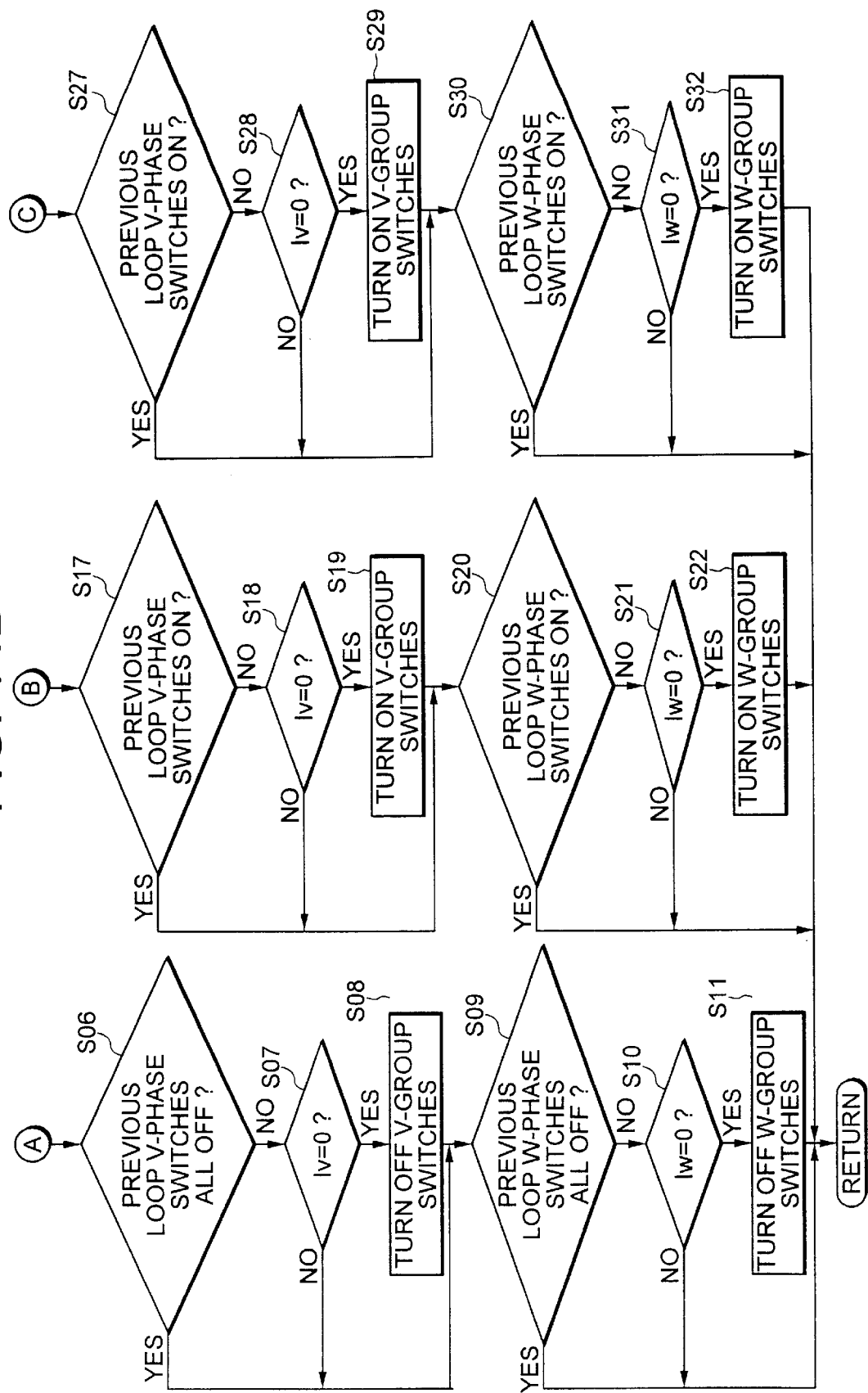

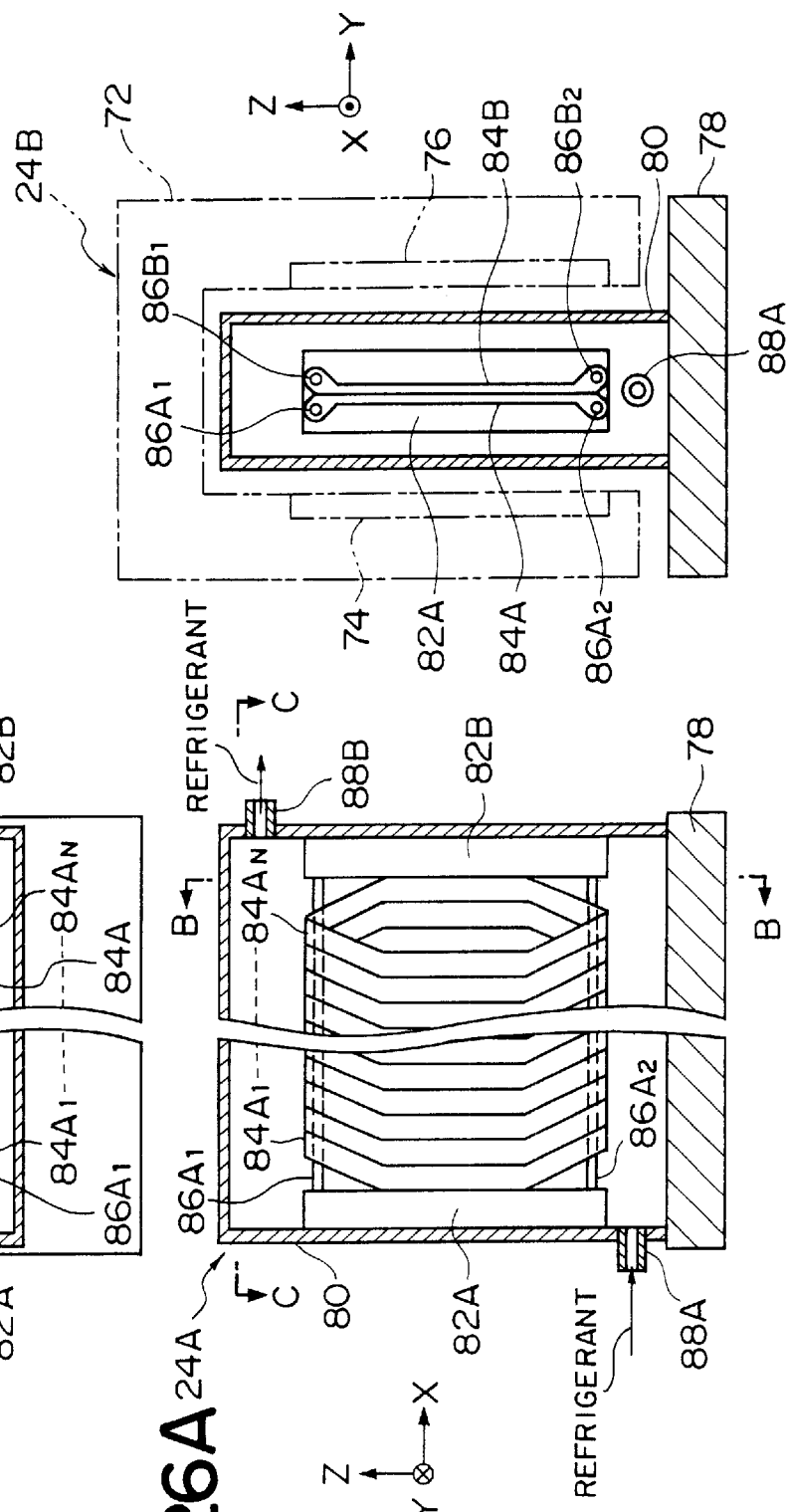

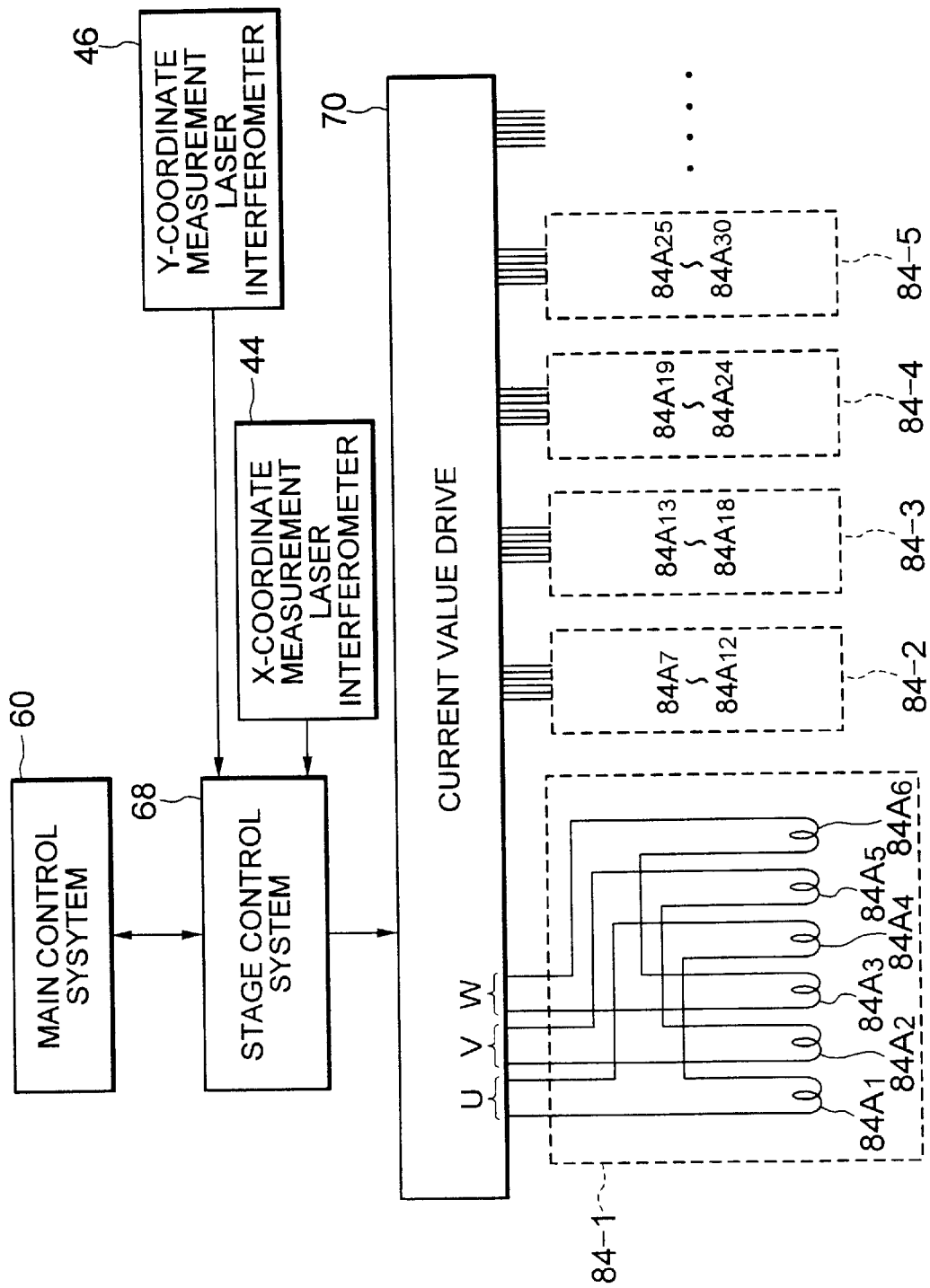

LINEAR MOTOR DEVICE, STAGE DEVICE, AND EXPOSURE APPARATUS

BACKGROUND OF THE INVENTION

1. Field of the Invention

The present invention relates to a linear motor device, stage device, exposure apparatus, etc., more particularly relates to a stage device suitable for moving a mask (reticle), wafer, or other object for movement used in an exposure apparatus, a linear motor device suitable for realizing such a stage device, an exposure apparatus to which such a stage device is applied, etc.

2. Description of the Related Art

In the past, in lithography for producing a semiconductor element, liquid crystal display element, etc., use has been made of an exposure apparatus for transferring a pattern formed on a mask or reticle (hereinafter referred to all together as a "reticle") through a projection optical system on to a wafer, glass plate, or other substrate coated with a resist etc. (hereinafter suitably referred to as a "photosensitive substrate or wafer"). As such an exposure apparatus, use is mainly made of a so-called "stepper" or other stationary exposure type of projection exposure apparatus or so-called scanning stepper or other scanning exposure type of projection exposure apparatus. These types of projection exposure apparatuses have to successively transfer a pattern formed on the reticle to a plurality of shot areas on the wafer, so have been provided with wafer stages able to move two-dimensionally while holding the wafers. Further, scanning exposure types of projection exposure apparatuses have reticle stages which can move in the scanning direction while holding a reticle.

Recent projection exposure apparatuses use linear motors as the electromagnetic actuators used as drive sources in reticle stages, wafer stages, or other stage devices. This is because a linear motor is simple in structure, has fewer number of parts, has less frictional resistance in the drive and therefore a higher operational accuracy, and enables fast movement since it drives motion directly and linearly and therefore is suitable for answering the demands for improving the throughput or positioning accuracy of the reticle stage, wafer stage, etc.

The performance sought from an electromagnetic actuator for driving the wafer stage in a stationary exposure type of projection exposure apparatus can be summarized as follows:

(A) High speed, that is, how quickly the wafer can be made to move to a target position;

(B) High accuracy, that is, how accurately the wafer can be made to move to a target position; and (C) Stability of stopping, that is, how stably a wafer can be stopped at the time of stopping it.

Further, the performance sought from the linear motor for driving the wafer stage in the scanning direction in a scanning exposure apparatus can be summarized as follows:

(D) High speed, that is, how quickly the wafer can reach a target position;

(E) Constant speed, that is, how fast and at how equal a speed the wafer can be scanned; and (F) High accuracy, that is, whether the relative positional relationship between the wafer stage and reticle stage can be maintained at a predetermined positional relationship.

Various linear motors have been developed to satisfy these many demands on performance. In general, a linear motor is comprised of a stator fixed to a predetermined member and a movable member fixed on a member moving with respect to that predetermined member. Where the stator includes coils, the movable member includes permanent magnets and other magnets. Where the stator includes magnets, the movable member includes coils. A linear motor in which magnets are included in the movable member and coils are included in the stator is called a "moving magnet type", while a linear motor in which coils are included in the movable member and magnets are included in the stator is called a "moving coil type".

A reticle stage or wafer stage in an exposure apparatus, however, requires accurate positioning, so when a linear motor is used, the problem sometimes arises of the heat generated by the coils causing minute changes in temperature which the affect the accuracy of the surrounding devices. For example, the heat generated by the coils sometimes causes fluctuations in the gas in the surrounding atmosphere and a reduction in the accuracy of position measurement by a laser interferometer. Further, along with the increase in size of the device produced, the reticle stage or wafer stage also becomes larger in size and greater in weight. Therefore, a linear motor with a large thrust has become desired for driving a reticle stage or wafer stage.

To increase the thrust of a linear motor, it may be considered to (1) increase the number of turns of the armature coil, (2) supply a large current to the armature coil, (3) increase the magnetic force of the permanent magnets, etc. These conditions, however, are mutually restrictive, so it becomes necessary to set the optimum conditions. For example, if increasing the number of turns of the armature coil for increasing the thrust, that many more airgaps become required. The thrust does not increase proportionally to the increase in the number of turns. To increase the number of turns without changing the airgaps, it is possible to reduce the diameter of the conductors of the coils, but if the diameter is reduced, the resistance rises. An increase in number of turns also raises the resistance. Therefore, the amount of heat generated becomes greater. Even if increasing the current, the amount of heat generated similarly becomes larger. If the size or scale of the linear motor is determined in this way, the maximum current, number of turns, resistance of the armature coil, airgaps, and other conditions are also determined. There have therefore been limits to increasing the thrust by such changes.

To remove the heat generated from the coils, it is known to provide cooling pipes around the coils or use heat insulating materials for blocking the transmission of the heat. With these methods, however, there have been problems of an inability to obtain the stability of temperature required for accurate positioning in an exposure apparatus or an increase in the size of the apparatus.

Further, when a large current is required for obtaining a high thrust, with the above conventional methods, a large amount of a refrigerant had to be circulated at a high speed or the cooling passage had to be made larger. High speed circulation of a refrigerant requires use of a high pressure circulation pump and places a load on the welds or joins of the circulation route and may lead to accidents such as leakage of the refrigerant.

SUMMARY OF THE INVENTION

An object of the present invention is to provide a linear motor device able to give a large thrust without increasing the amount of generation of heat.

Another object of the present invention is to provide a stage device able to realize high precision movement or positioning.

Still another object of the present invention is to provide an exposure apparatus with a high exposure accuracy.

Still other objects of the present invention will become clear from the following description.

According to a first aspect of the present invention for achieving the above object, there is provided a linear motor device comprising a movable member, a stator having coils, and a control system for powering selected coils among the coils in accordance with a position of the movable member. According to this configuration, since the control system for powering coils selected in accordance with the position of the movable member is employed, for example it becomes possible to power just coils interacting with the movable member and therefore enable efficient driving and possible to obtain a large thrust without increasing the amount of heat generated.

According to a second aspect of the present invention for achieving the above other object, there is provided a stage device comprising a linear motor device and stage, the linear motor device including a movable member, a stator having coils, and a control system for powering selected coils among the coils in accordance with a position of the movable member, and the stage being connected to the movable member. Due to this configuration, in accordance with the present invention, it is possible to keep down the amount of generation of heat of the linear motor, so it is possible to improve the accuracy of position measurement by means of a laser interferometer because of preventing the fluctuations of the gas in the atmosphere around the stage and further possible to keep down the heat expansion of the stage and other peripheral parts and as a result improve the movement or positioning accuracy of the stage.

According to a third aspect of the present invention for achieving the still other object, there is provided an exposure apparatus for exposing a photosensitive substrate through a mask formed with a pattern, comprising a stage device for moving at least one of the mask and photosensitive substrate, the stage device being provided with a linear motor device including a movable member, a stator having coils, and a control system for powering selected coils among the coils in accordance with a position of the movable member and a stage connected to the movable member. According to this configuration, since the movement and positioning accuracy of the stage is high, it becomes possible to transfer an image of the pattern formed on the mask to the photosensitive substrate with a good accuracy.

BRIEF DESCRIPTION OF THE DRAWINGS

FIG. 3A and FIG. 3B are longitudinal sectional views of a stator and movable member of the linear motor of the first embodiment of the present invention;

FIG. 14A and FIG. 14B are serial flow charts of a powering/interrupting control program of the first embodiment of the present invention;

FIG. 26A to FIG. 26C are sectional views of the schematic configuration of an armature unit of a linear motor used for the wafer stage device of FIG. 24;

FIG. 28 is a block diagram of a control system for control of the supply of current to a group of element group shown in FIG. 26A to FIG. 26C.

DESCRIPTION OF THE PREFERRED EMBODIMENTS

Embodiments of the present invention will be explained in detail below with reference to the drawings.

First Embodiment

Figure 1:
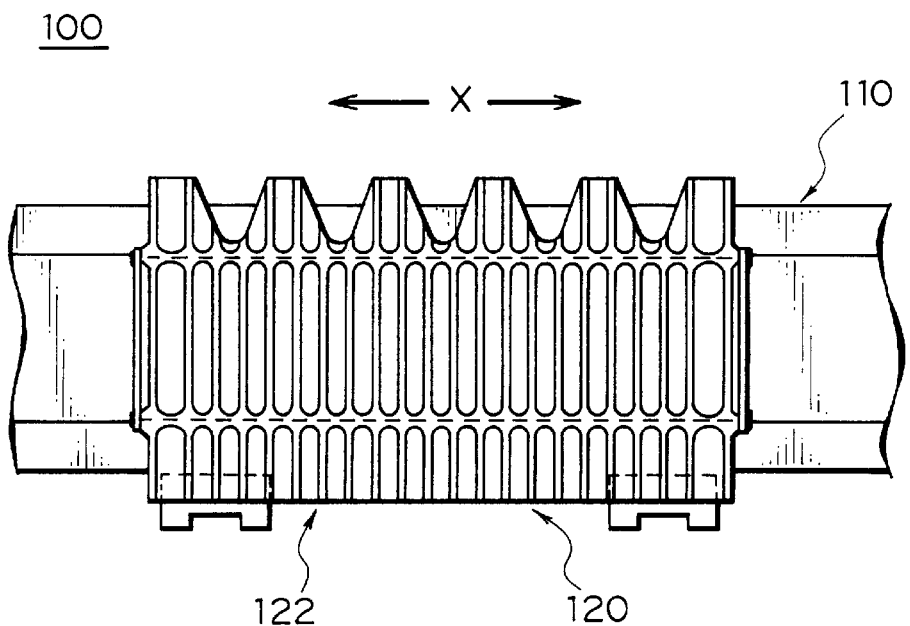
FIG. 1 is a side view of a linear motor of a first embodiment of the present invention.
Figure 2:
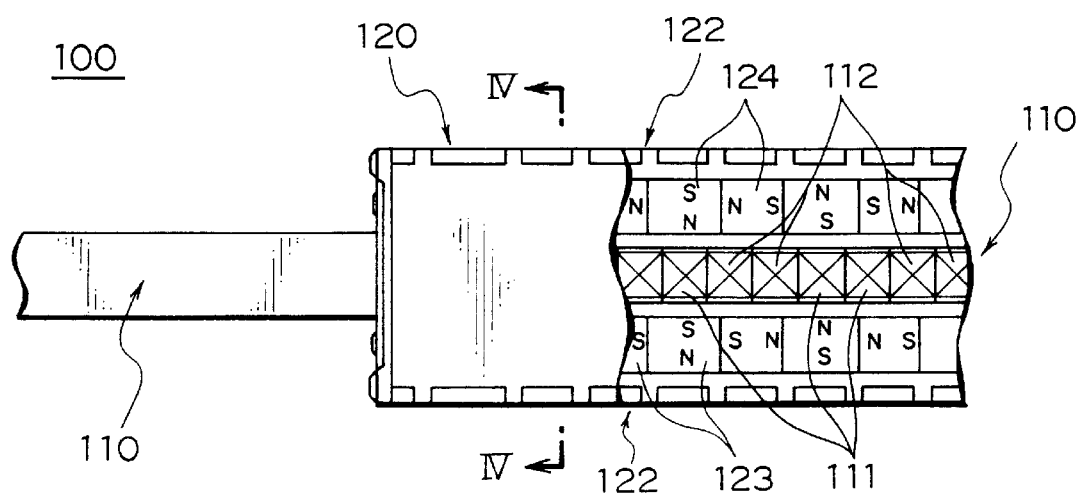
FIG. 2 is a plan view of the linear motor of the first embodiment of the present invention with part of the movable member cut away.

A first embodiment of the present invention will be explained below using FIG. 1 to FIG. 14. The linear motor 100 of the first embodiment, as shown in FIG. 1 and FIG. 2, is comprised of a stator 110 and a movable member 120. In this embodiment, the linear motor 100, the later-mentioned controller 200, and switches (S01 to S30) constitute a linear motor device.

Here, the stator 110 is comprised of a first row of coils 111, 111 . . . , a second row of coils 112, 112 . . . , and a housing 113 formed to surround them. The housing 113, as shown in FIG. 3A, water-tightly seals the first row of coils 111, 111 . . . and second row of coils 112, 112 . . . Inside the housing 113 is arranged a coolant passage 115 for cooling the first row of coils 111, 111 . . . and the second row of coils 112, 112 . . . Further, the large number of coils 111, 111 . . . are fixed to the housing 113 by the fixing members 114, 114 . . .

Figure 4:
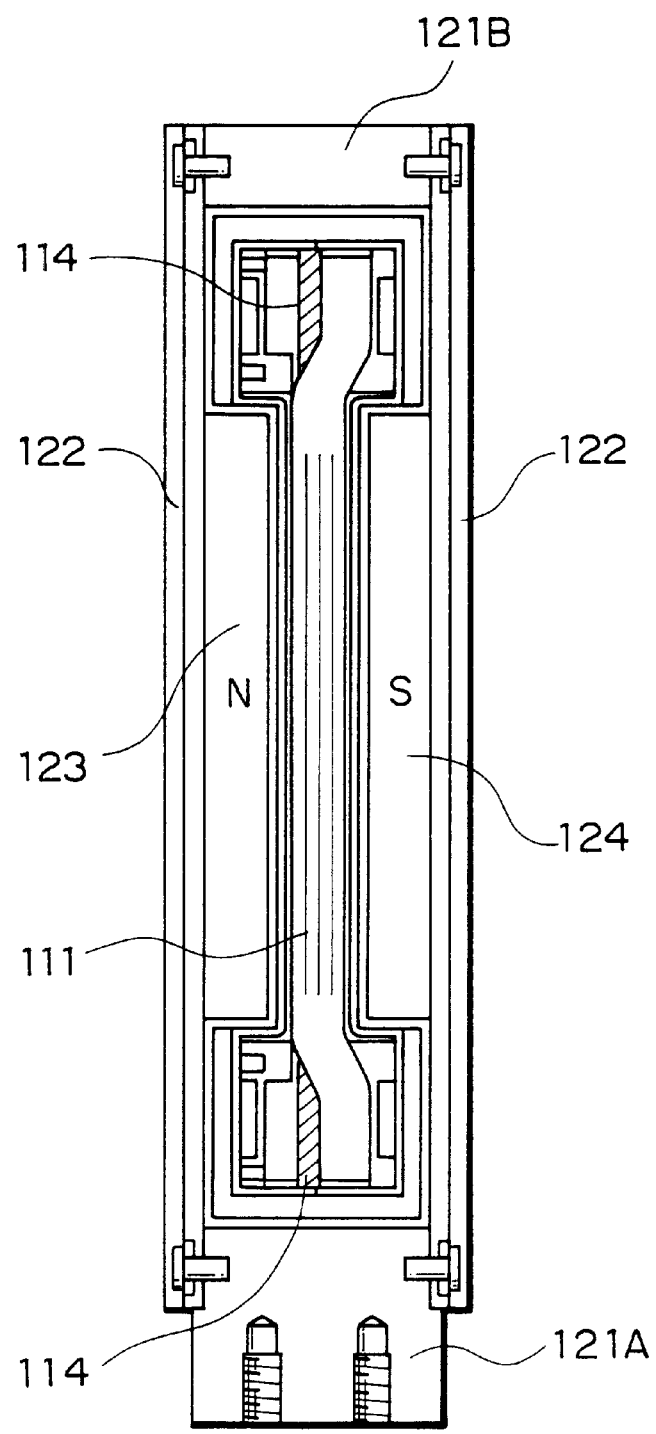
FIG. 4 is a longitudinal sectional view along the line IV—IV of FIG. 2.

On the other hand, the movable member 120, as shown in FIG. 3B, is comprised of base parts 121A, 121B, yokes 122, 122 screwed to these, and a first row of permanent magnets 123, 123 . . . and a second row of permanent magnets 124, 124 . . . arranged inside the yokes 122, 122. These permanent magnets 123, . . . , 124, . . . constitute the later explained magnet unit 120A. Further, while the permanent magnets 123, 124 are used as means for generating magnetic flux in the magnet unit 120A, it is also possible to use electromagnets and other magnet members. Further, the stator 110 is inserted into a hollow portion 120S of the movable member 120 to thereby complete the linear motor 100 (FIG. 4).

The first row of coils 111, 111 . . . and second row of coils 112, 112 . . . provided at the stator 110 of the linear motor 100 are divided into a W-phase group of coils 111(W) . . . , 112(W) . . . , V-phase group of coils 111(V) . . . , 112(V) . . . , and U-phase group of coils 111(U) . . . , 112(U) . . . in accordance with the waveform of the current flowing there (W-phase, V-phase, and U-phase). Current of a predetermined phase difference (Iu, Iv, Iw) flows to each group of coils whereby the movable member 120 moves in the direction indicated by the arrow X in FIG. 1 with respect to the stator 110.

Figure 5:
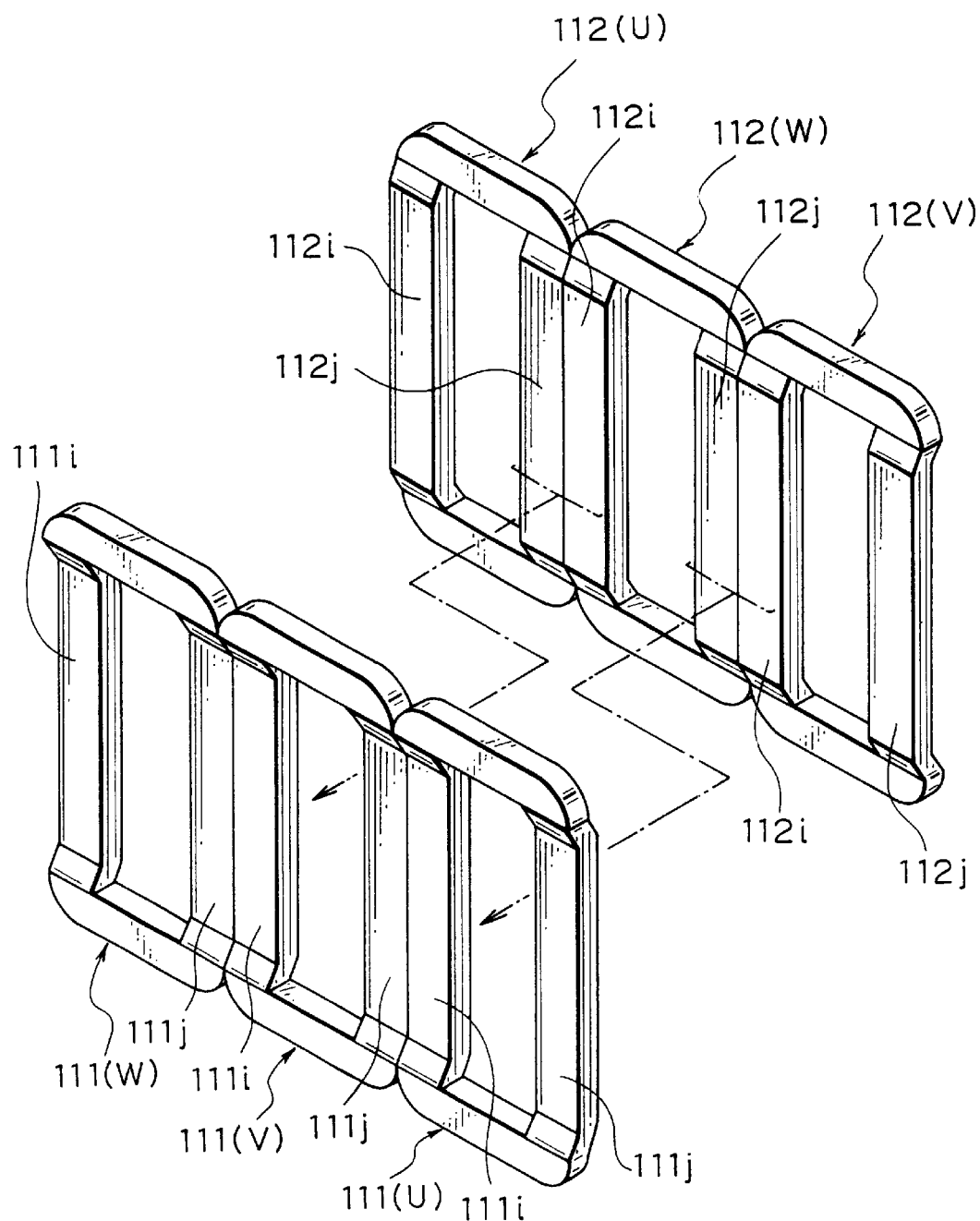
FIG. 5 is an explanatory view of the shape of a first row of coils and a second row of coils of the first embodiment of the present invention.
Figure 6:
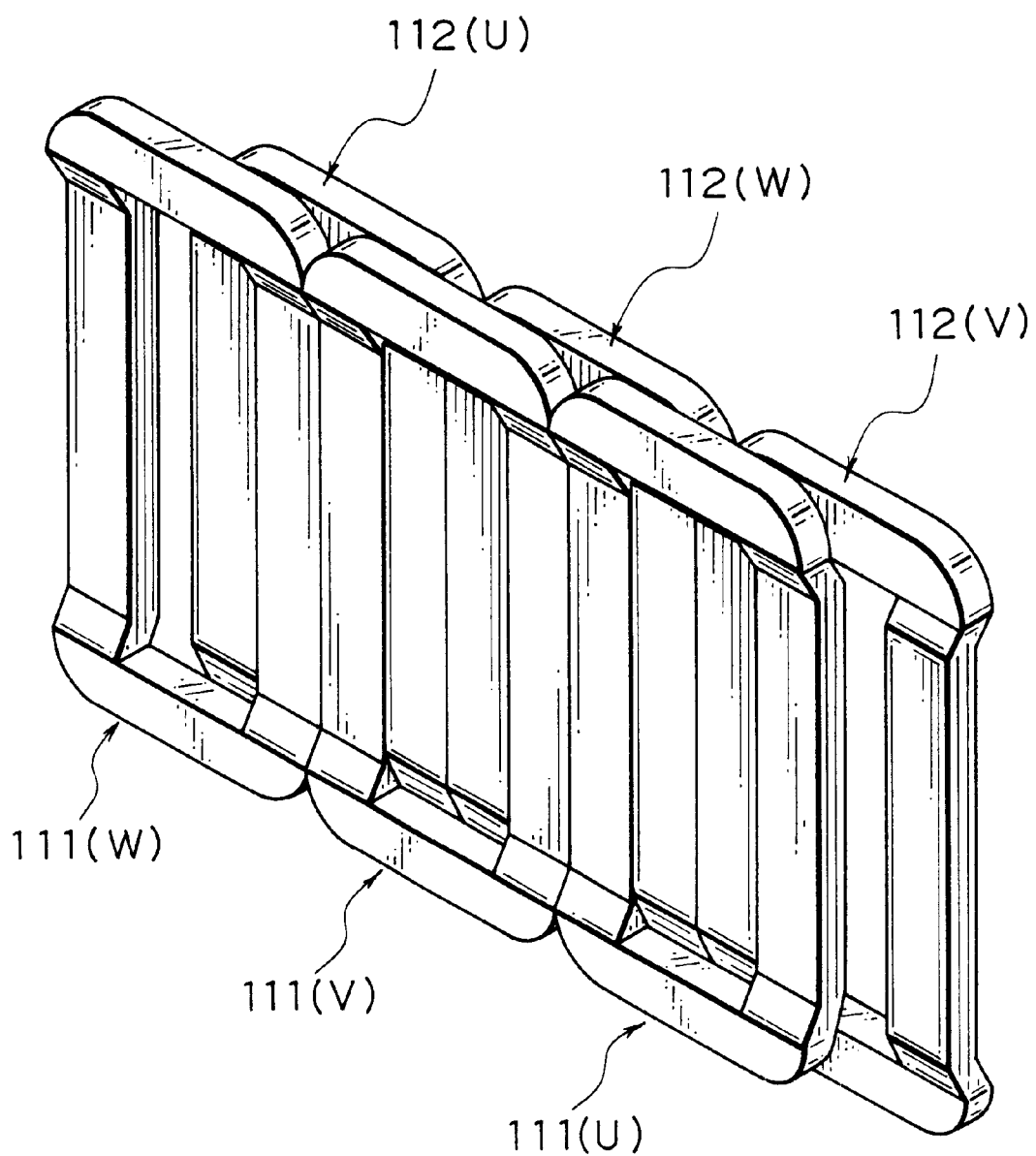
FIG. 6 is an explanatory view of the state of fit of the first row of coils and second row of coils of the first embodiment of the present invention.
Figure 7:
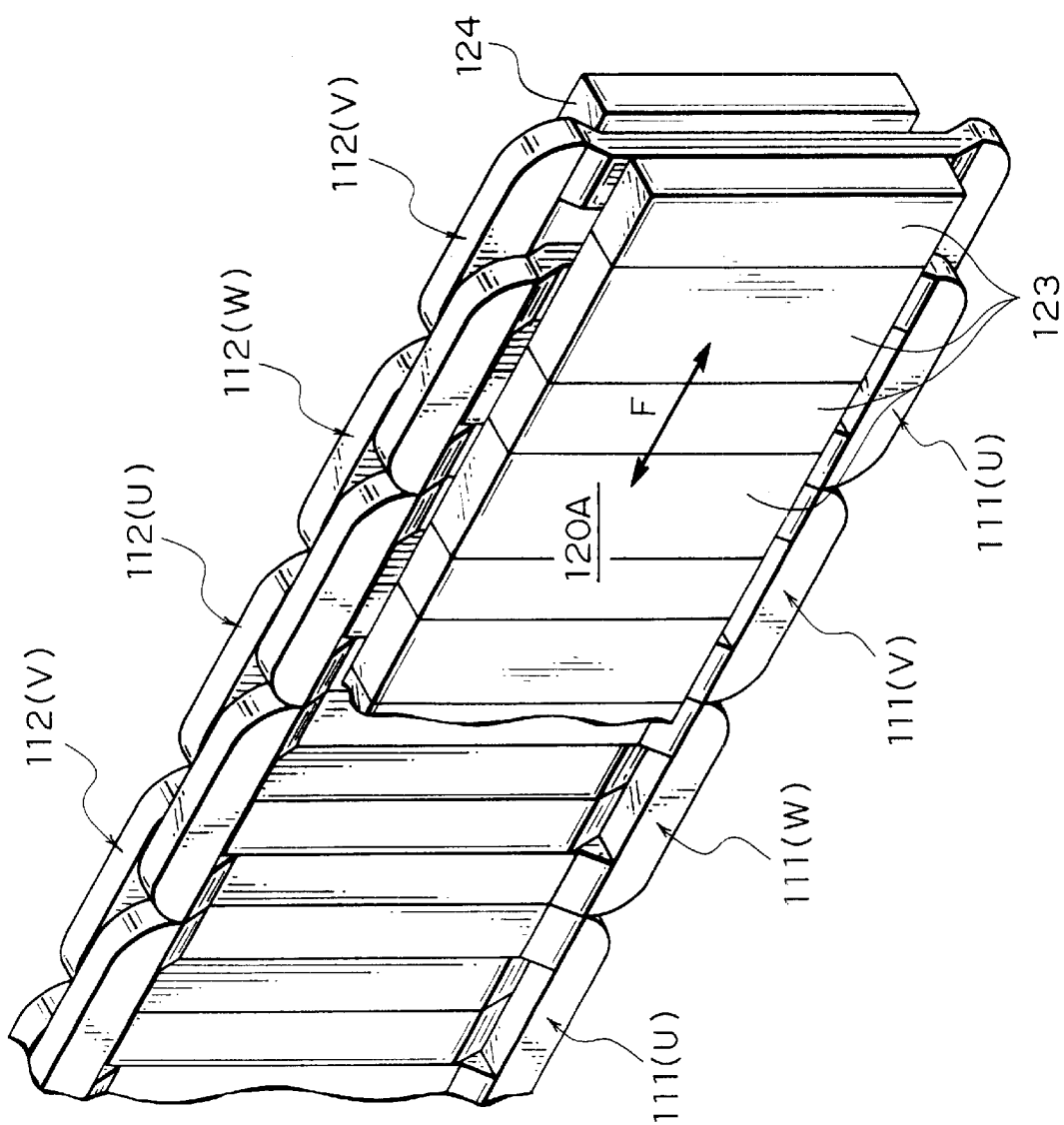
FIG. 7 is an explanatory view of the positional relationship of the first row of coils and second row of coils of the first embodiment of the present invention.

Here, the shape and arrangement of the first row of coils 111, 111 . . . and the second row of coils 112, 112 . . . arranged inside the stator 110 will be explained using FIG. 5 to FIG. 7. The stator 110 of this embodiment is a stator of the so-called "dog bone type". The first row of coils 111, 111 . . . and second row of coils 112, 112 . . . constituting the stator 110 are, as shown in FIG. 5, rectangular coils obtained by winding the conductors in a rectangle. The first row of coils 111, 111, . . . of the stator 110 arranged at the front in FIG. 5 have portions 111i, 111j extending in the vertical direction (hereinafter referred to as "pole portions") which are bent toward the rear. The pole portions 111i, 111j act together with the magnetic poles of the magnet unit 150 to generate a thrust F.

On the other hand, the second row of coils 112, 112 . . . arranged at the rear in FIG. 5 have pole portions 112i, 112j bent toward the front.

The first row of coils 111, 111 . . . and second row of coils 112, 112 . . . , as shown by the arrows in FIG. 5, fit at their respective center portions with the pole portions 112i, 112j of the second row of coils 112 and the pole portions 111i, 111j of the first row of coils 111. As a result, the first row of coils 111, 111 . . . and the second row of coils 112, 112 . . . have pole portions 111i, 111j . . . , 112i, 112j . . . arranged on a straight line at the center portion of the stator 110 (FIG. 2 and FIG. 6). The permanent magnets 123, 123 . . . 124, 124 . . . of the movable member 120 are arranged, as shown in FIG. 7, at the two sides of the first row of coils 111, 111 . . . and second row of coils 112, 112 . . . with the pole portions 111i, 111j, 112i, 112j arranged on the straight line so as to sandwich them.

Figure 8:
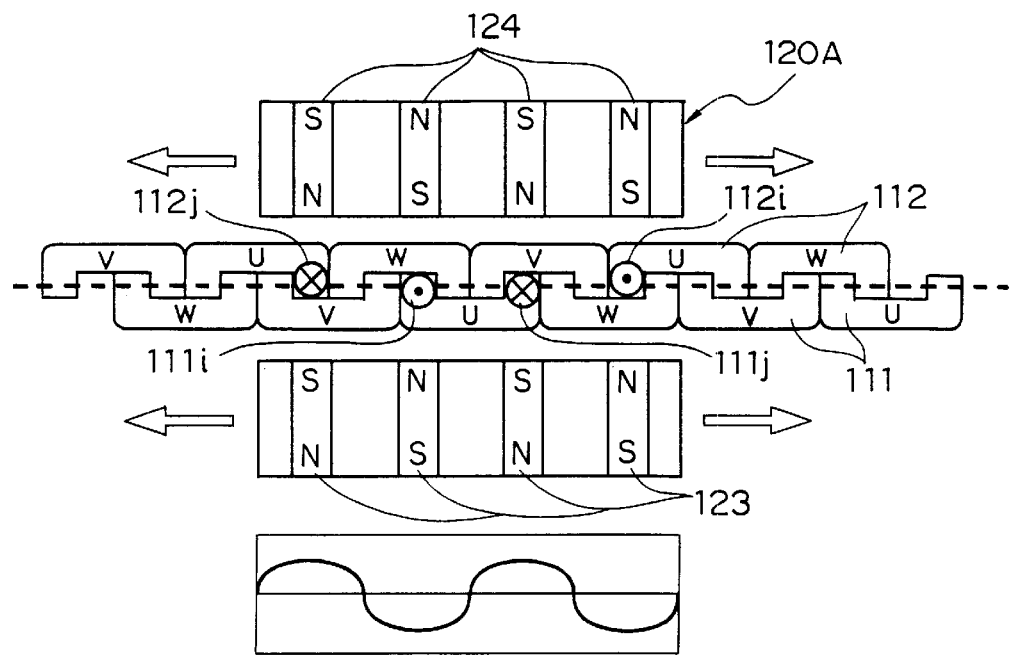
FIG. 8 is an explanatory view for explaining the principle of operation of the linear motor of the first embodiment of the present invention.

Next, the principle of operation of the linear motor 100 will be explained using FIG. 8, FIG. 9, and FIG. 10A to FIG. 10F. In FIG. 8, to simplify the explanation, the example is shown of the magnet unit 120A made by a total of eight permanent magnets 123, . . . 124, . . . Further, permanent magnets forming commutating poles at the magnet unit 120A shown in FIG. 8 are not shown. In the magnet unit 120A, the permanent magnets 123, 123 . . . , 124, 124 . . . form four magnet poles. In FIG. 8, the wavy line shows the distribution of magnetic flux density by the magnet unit 120A. The number of peaks is the number of magnetic poles.

Further, in FIG. 8, the letter "U" is attached to coils carrying the current Iu among the first row of coils 111, 111 . . . and the second row of coils 112, 112 . . . , the letter "V" is attached to coils carrying the current Iv, and the letter W is attached to coils carrying the current Iw. Further, the direction of flow of the current Iu is shown as an example in FIG. 8. The following explanation of the direction of generation of thrust is predicated on the flow of current in the direction of FIG. 8.

Here, the explanation will be made of the current Iu of the "U-phase", the current Iv of the "V-phase", and the current Iw of the "W-phase" flowing through the coils 111, 111 . . . , 112, 112 . . . of the movable member 120 of the linear motor 100. When the movable member 120 is at the position shown in FIG. 8, the current Imax shown at the time t0 of FIG. 9 flows to the pole portions 111j, 111j, 112i, and 112j. At this time, a thrust F in the right direction of FIG. 8 is obtained.

Figure 9:
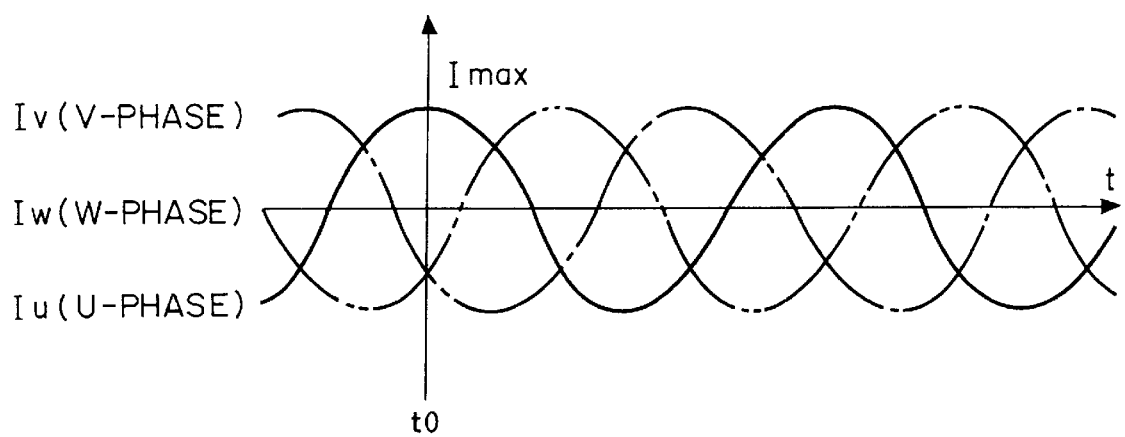
FIG. 9 is a graph of the waveforms of the currents Iu, Iv, and Iw of the first embodiment of the present invention.
Figure 10A:
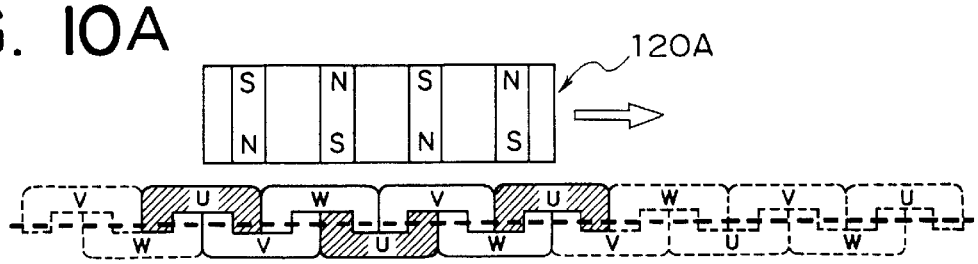
FIG. 10A to FIG. 10F are explanatory views of the state of change of coils facing a magnet unit of the first embodiment of the present invention due to movement of the unit.
Figure 10B:
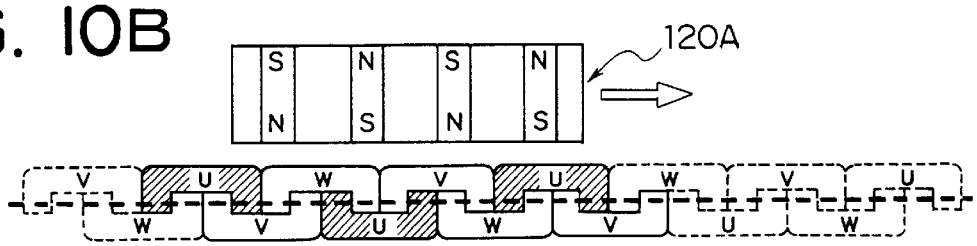
Figure 10C:
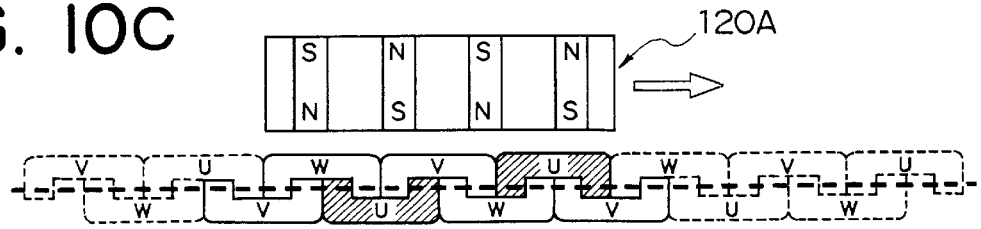
Figure 10D:
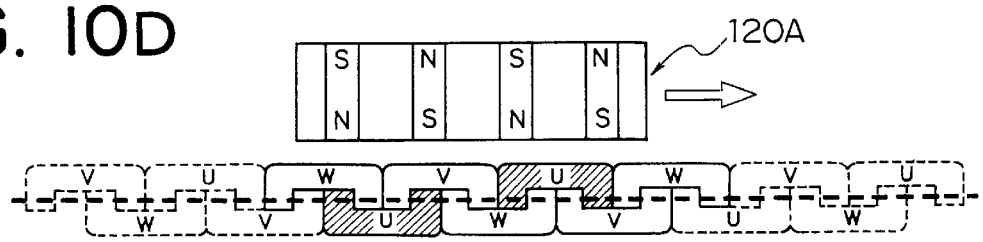
Figure 10E:
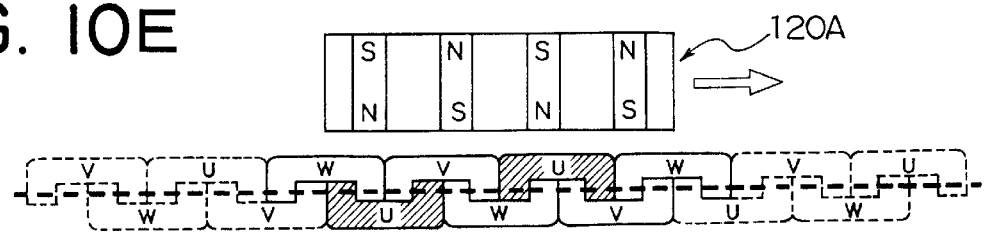
Figure 10F:
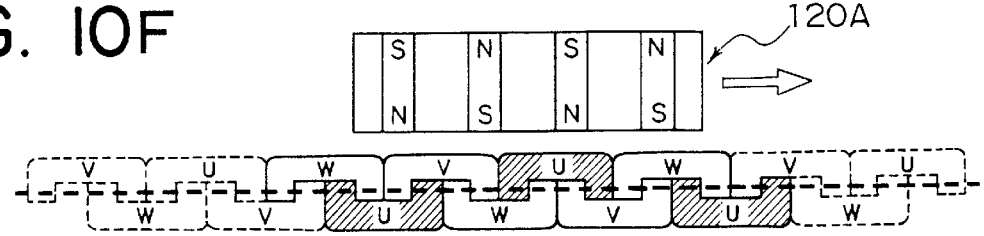

Here, by changing the currents Iu, Iv, and Iw flowing through the U-phase group of coils 111(U) . . . , 112(U) . . . , the V-phase group of coils 111(V) . . . , 112 (V) . . . , and W-phase group of coils 111(W) . . . , 112 (W) . . . as shown in FIG. 9, the movable member 120 moves in the right direction in FIG. 8 with respect to the stator 110. Further, the currents Iu, Iv, and Iw have waveforms of phase differences of $2\pi/3$ from each other. If the flow of current to the coils 111, 111 . . . , 112, 112 . . . is interrupted, the movable member 120 stops. Further, if the phases of the currents Iu, Iv, and Iw flowing through the coils 111, 111 . . . , 112, 112 . . . are shifted by 180 degrees with respect to the waveform shown in FIG. 9, the movable member 120 moves in the left direction.

In the linear motor 100 of the first embodiment, not all of the coils 111, 111 . . . , 112, 112 . . . of the stator 110 are powered. By powering only the number of coils 111, 111 . . . , 112, 112 . . . corresponding to the number of magnetic poles of the magnet unit 120A, the power consumption is kept down and the motor constant is raised. By powering at least one of the coils 111, 111 . . . , 112, 112 . . . facing the magnet unit 120A, it is possible to obtain a thrust for driving the movable member 120. In this embodiment, to obtain a sufficient thrust, a number of coils corresponding to the number of coils 111, 111 . . . , 112, 112 . . . facing the magnet unit 120A are powered.

However, the number of coils 111, 111 . . . , 112, 112 . . . facing the magnet unit 120A changes depending on the position of the movable member 120. FIG. 10A to FIG. 10F shows the state of change of the number of coils 111, 111 . . . , 112, 112 . . . facing the magnet unit 120A corresponding to the position of movement of the unit. The coils 111, 111 . . . , 112, 112 . . . shown by the solid lines in the figure are the coils facing the magnet unit 120A.

Here, consider the number of facing coils taking note of only the U-phase coils 111(U), 111(U) . . . , 112(U), 112(U) . . . As shown in the figure, the number of U-phase coils 111(U), . . . , 112(U), . . . (shown by hatching) facing the magnet unit 120A (number of magnetic poles=4) changes as "3"→"3"→"2"→"2"→"2"→"3" . . . That is, for a magnet unit 120A having four magnetic poles, the number of U-phase coils 111(U), 111(U) . . . , 112(U), 112(U) . . . facing it changes between two and three. The same is true for the V-phase and W-phase coils.

Figure 11A:
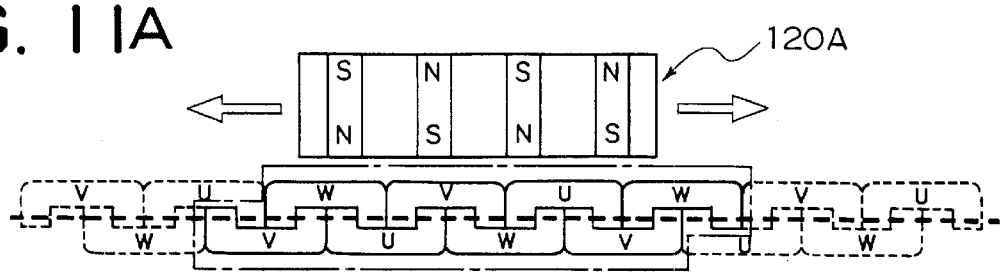
FIG. 11A to FIG. 11E are explanatory views of the positional relationship between coils to be powered and the magnet unit according a first method of the first embodiment of the present invention.

FIG. 11A shows the state of two U-phase coils, three V-phase coils, and three W-phase coils (total eight surrounded by one-dot chain line) facing the magnet unit 120A. If considering the optimal value of the motor constant of the linear motor 100, only these eight coils 111, 111 . . . , 112, 112 . . . facing the magnet unit 120A should be excited.

In the linear motor 100, however, there is the demand that the total resistances of the U-phase, V-phase, and W-phase groups of coils be made the same values. Therefore, if two U-phase coils, three V-phase coils, and three W-phase coils are powered in the above way, an imbalance ends up occurring. This imbalance becomes a problem in control. Therefore, the numbers of coils powered in the groups of coils of the U-phase, V-phase, and W-phase have to be made to match. Therefore, in this embodiment, considering this demand, the numbers of coils 111, 111 . . . , 112, 112 . . . able to be powered in the U-phase, V-phase, and W-phase groups of coils and the coils actually powered are determined by the following two methods so as to raise the motor constant.

[First Method]

In the first method, when the numbers of the coils 111, 111 . . . , 112, 112 . . . in the U-phase, V-phase, and W-phase groups of coils facing the magnet unit 120A (number of magnetic poles=4) change, taking note of the fact that the minimum value is "2" and considering the fact that the magnet unit 120A moves to the left and right, the two coils facing the unit and the one coil to the left and right of the same (two coils not facing unit) are powered. In this case, the number of coils powered is a total four for each of the groups of coils of the U-phase, V-phase, and W-phase.

Figure 11B:
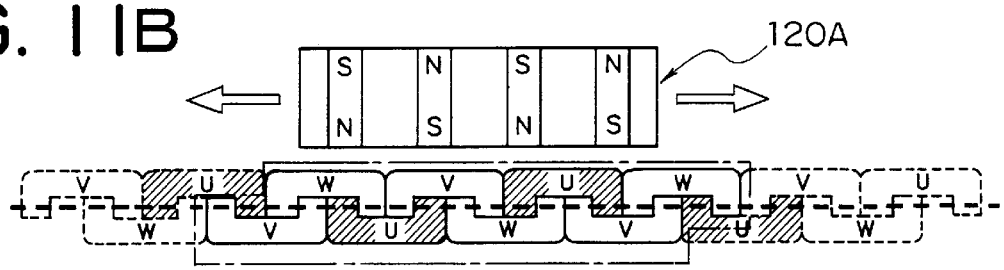
Figure 11C:
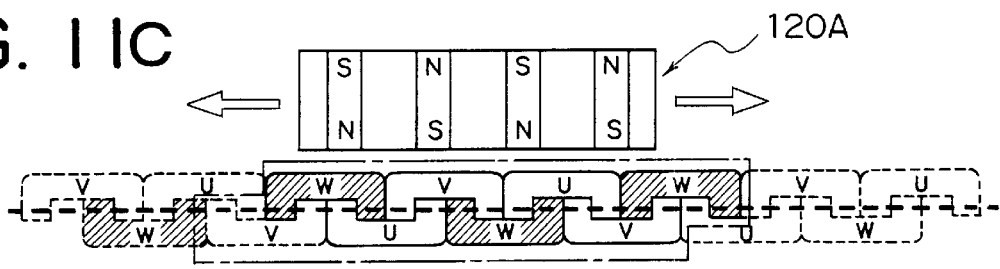
Figure 11D:
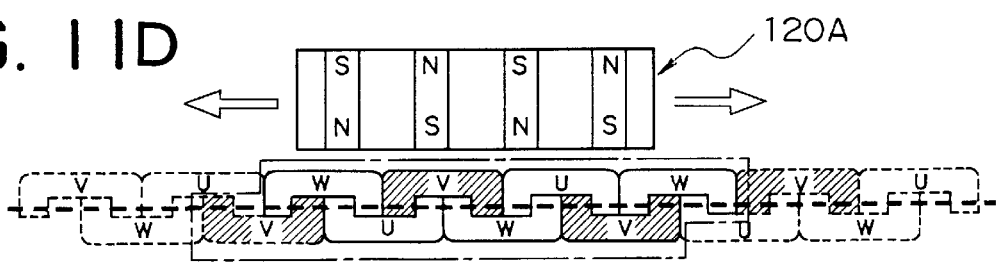
Figure 11E:
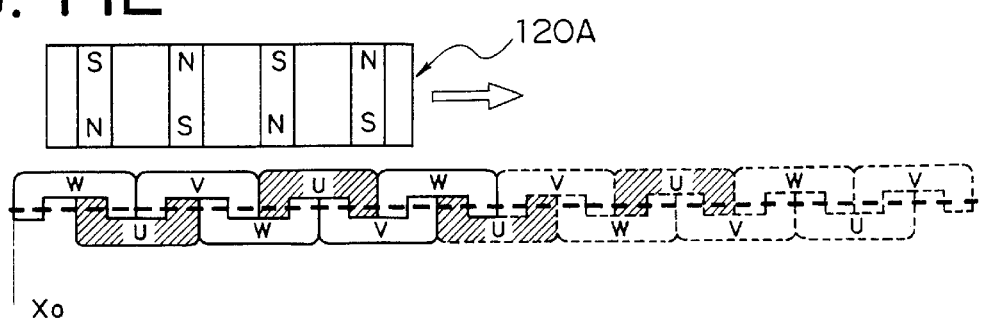

FIG. 11B to FIG. 11D show, for each of the U-phase, V-phase, and W-phase, the coils 111, 111 . . . , 112, 112 . . . which are powered in the state where the above magnet unit 120A faces two U-phase coils, three V-phase coils, and three W-phase coils. In the illustrated example, there are two U-phase coils facing the magnet unit 120A (two shown by hatching among eight surrounded by one-dot chain line). Therefore, the remaining two coils to be powered are, as shown in FIG. 11*b,* the two coils at the two sides adjoining them (coils without hatching in coils shown by broken lines).

At this time, there are a total of three each of the V-phase and W-phase coils facing the magnet unit 120A as shown in FIG. 11C and FIG. 11D (three shown by hatching among eight surrounded by one-dot chain line). The remaining one to be powered is the coil 11*oq* closer from the side end of the magnet unit 120A (coil without hatching in coils shown by broken lines). Further, when the magnet unit 120A is close to the end X0 of the stator 110, the remaining coil to be powered is the adjoining coil at the side opposite to the end X0. In a group containing two coils facing the magnet unit 120A (U-phase of FIG. 11E), the two remaining coils to be powered both become the opposite side of the end X0.

[Second Method]

In the second method, when the number of the coils 111, 111 . . . , 112, 112 . . . facing the magnet unit 120A (number of magnetic poles=4) changes along with movement of the unit, taking note of the fact that the minimum value is "2" at each of the U-phase, V-phase, and W-phase, only one coil adjoining each two coils either at the right or left is powered so as to supply the minimum necessary current for driving the movable member 120. In this case, the number of coils powered becomes three for each group of coils for each of the U-phase, V-phase, and W-phase.

Figure 12A:
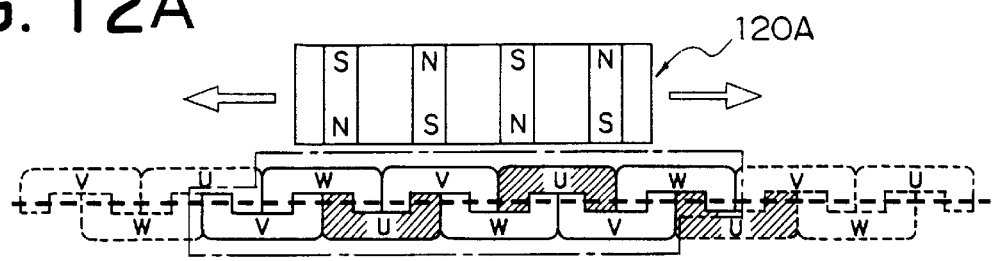
FIG. 12A to FIG. 12C are explanatory views of the positional relationship between coils to be powered and the magnet unit according to a second method of the first embodiment of the present invention.
Figure 12B:
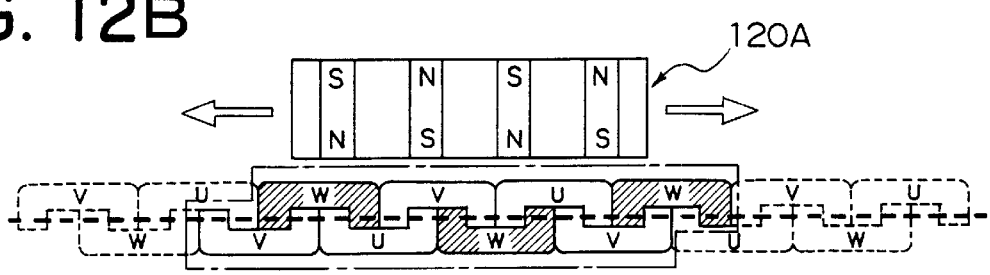
Figure 12C:
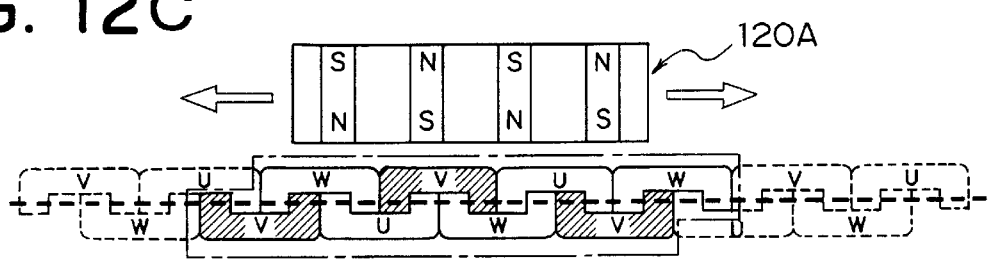

FIG. 12A, like FIG. 11A, shows, for each of the U-phase, V-phase, and W-phase, the coils 111, 111 . . . , 112, 112 . . . which are powered when the above magnet unit 120A faces two U-phase coils, three V-phase coils, and three W-phase coils (total of eight surrounded by one-dot chain line). In the illustrated example, there are two U-phase coils facing the magnet unit 120A. Therefore, as the remaining coil to be powered, as shown in FIG. 12A, the coil closer to the magnet unit 120A among the two adjoining coils at the two sides is selected (coil without hatching in coils shown by broken lines). At this time, there are a total of three each of the V-phase and W-phase coils facing the magnet unit 120A as shown in FIG. 12B and FIG. 12C (three shown by hatching among eight surrounded by one-dot chain line). Therefore, it is sufficient to power only these coils of the V-phase and W-phase.

In this way, in the second method, it is possible to reduce the number of coils powered compared with the first method (three). This is due to the following reasons. In the first method, the coils at the two sides were powered considering the fact that the magnet unit 120A moves to the left and right, but with powering/interruption control (FIG. 13 and FIG. 14) of the coils 111, 111 . . . , 112, 112 . . . using the later explained switches (S01) to (S30), the switching speed is far faster than the speed of movement of the linear motor 100, so fine motion of the magnet unit 120A can be sufficiently tracked. Further, as explained later, by operating the switches (S01) to (S30) when the currents Iu, Iv, and Iw become "0", there is no longer a need to consider the startup delay of the current due to the L-component or the transient response of current.

Figure 13:
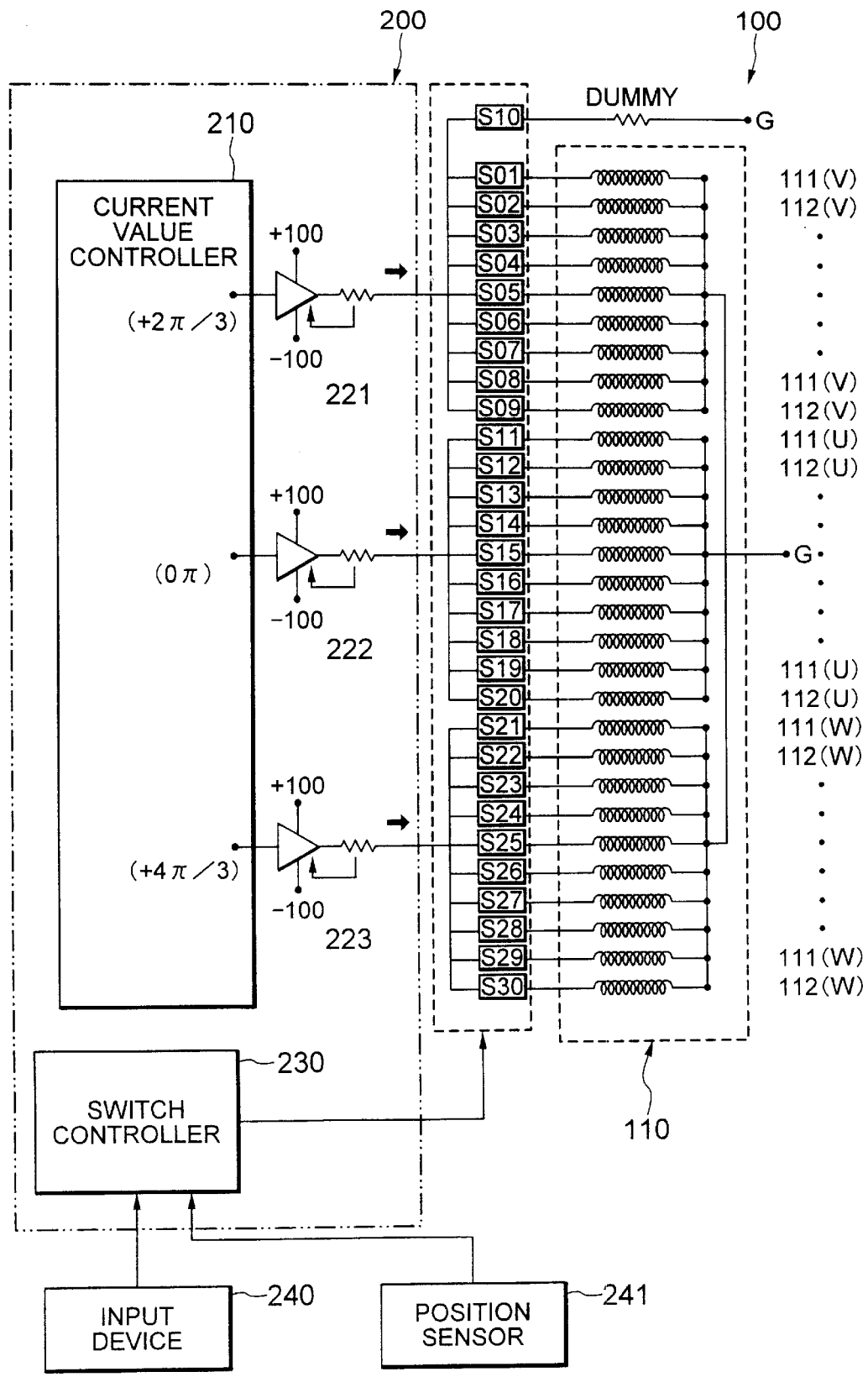
FIG. 13 is a circuit diagram of a linear motor of the first embodiment of the present invention and a controller for controlling its operation.
Figure 14A:
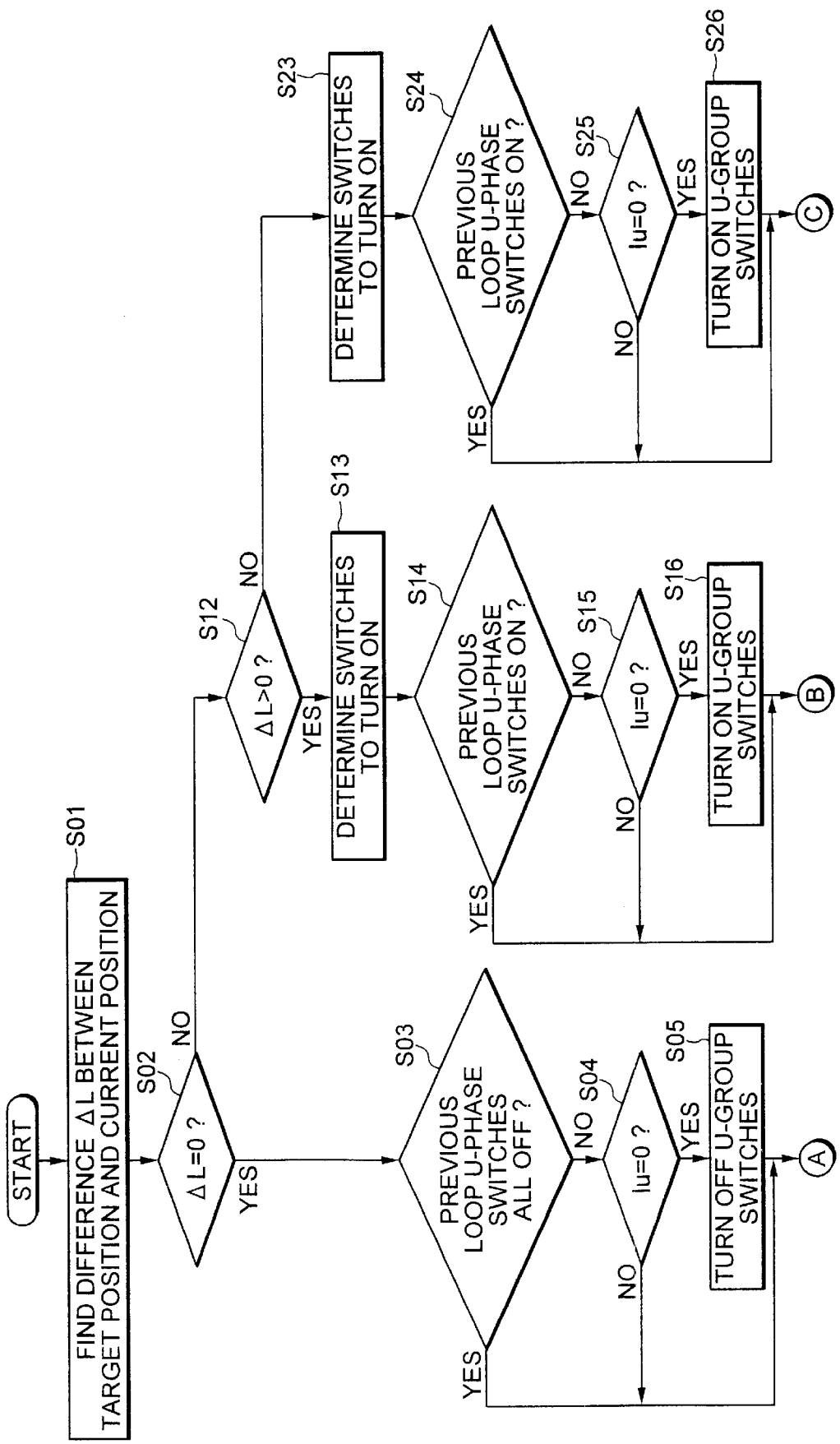

Next, the explanation will be made, using FIG. 13 to FIG. 14, of the control of the linear motor 100 to turn on (power)/off (interrupt) the currents Iu, Iv, and Iw flowing to each of the groups of coils 111(W) . . . , 112(W) . . . , 111(V) . . . , 112(V) . . . , 111(U), and 112(U) . . . of the coils 111, 111 . . . and coils 112, 112 . . . of the linear motor 100 for each of the coils 111, 112 . . . using the switches (S01, S02, . . . S30).

In this embodiment, the currents Iv, Iu, and Iw supplied from a current value controller 210 are used to power only the coils for actually generating the thrust F by controlling the on/off states of the V-phase switches (S01) to (S10), the U-phase switches. (S11) to (S20), and the W-phase switches (S21) to (S30) by a switch operation controller (switch control means) 230 whereby the power consumption is kept down and excessive heat is prevented from being generated. That is, as shown in FIG. 13, a controller 200 is comprised of the current value controller (current controller) 210 for generating the currents Iv, Iu, and Iw, three amplifiers 221, 222, and 223 for generating desired currents Iv, Iu, and Iw in accordance with voltage values appearing at the three terminals of the current value controller 210, and the switch operation controller 230 for turning on/off the V-phase, U-phase, and W-phase switches (S01) to (S30). Further, the switch operation controller 230 has connected to it an input unit 240 for inputting a target position of a movable member 120 of the linear motor 100 and a position sensor (position detecting means using interferometer) 241 for detecting a current position of the movable member 120.

Between the amplifier (V-phase) 221, amplifier (U-phase) 222, and amplifier (W-phase) 223 of the controller 200 and the V-phase group of coils 111(V) . . . , 112(V), U-phase group of coils 111(U) . . . , 112(U) . . . , and W-phase group of coils 111(W) . . . , 112(W) . . . are arranged the V-phase switches (S01) to (S10), the U-phase switches (S11) to (S20), and the W-phase switches (S21) to (S30). Further, the U-phase group of coils 111(U), 112(U), W-phase group of coils 111(W), 112(W), and V-phase group of coils 111(V), 112(V) are actually arranged at the stator 110, as shown in FIG. 6, in the order of the W-phase, V-phase, and U-phase from the left.

In this embodiment, the on/off states of the switches (S01) to (S30) of the linear motor 100 are separately controlled for each of the switches (S01) to (S30) as shown below. Further, the numbers of coils powered in the U-phase, V-phase, and W-phase are the same. This is so as to make the total resistance values of the coils powered in the U-phase, V-phase, and W-phase match at the phases. The coils to be powered are determined by either of the above first method and second method.

Since the numbers of the coils powered in the U-phase, V-phase, and W-phase match in this way, in the examples shown in FIG. 10A to FIG. 10F, so-called star-connections with common terminals (G) on the output side are used. Due to this, it is possible to reduce the number of wires led from the first row of coils 111, 111 . . . and second row of coils 112, 112 . . . , which are sealed water-tightly by the housing 113, to the outside (in particular the output side wires). Further, the dummy resistor (Dummy) shown in FIG. 13 is provided when there is not enough space for making the numbers of the U-phase, V-phase, and W-phase coils the same (in the example of FIG. 13, 30 coils are required). Due to this, it is possible to make the resistance values of the phases match even when all switches (S01 to S30) are turned on.

Next, an explanation will be given of the "powering/interruption control program" executed by the switch operation controller 230. By executing this powering/interruption control program, the switches (S01) to (S30) of the groups of coils (V-phase, U-phase, and W-phase) are separately controlled in on/off states, the coils contributing to the generation of the thrust are selectively powered, and therefore the operation of the linear motor 100 can be controlled to consume less power and generate less heat. When this powering/interruption control program is started, first, at step S01, the target position of the movable member 120 input from the input unit 240 and the current position of the movable member 120 detected by the position sensor 241 are compared and the difference ΔL found. At the next step S02, it is judged if the difference (ΔL) is "0" or not. When the result of the judgement is "Yes", it is judged if the movable member 120 is already at the target position and processing for stopping the movable member 120 (step S03 to step S11) is executed.

On the other hand, when the result of judgement of step S02 is "No", it is further judged if the difference (ΔL) is a positive value or negative value (step S12). When a positive value, processing for making the movable member 120 move in the positive direction (right direction in FIG. 8) (step S13 to step S22) is executed, while when a negative value, processing for making the movable member 120 move in the negative direction (left direction in FIG. 8) (step S23 to step S32) is executed.

First, processing for stopping the movable member 120 is explained. If proceeding to the processing for stopping the movable member 120 (processing from step S3 on), first, at step S03, it is judged if all U-phase switches (S11) to (S20) were off in the previous loop. When the result of judgement is "Yes", that is, when all of the U-phase switches (S11) to (S20) were off in the previous loop, the routine proceeds to step S06.

On the other hand, if not all of the U-phase switches (S11) to (S20) were off, at step S04, it is judged if the U-phase current Iu is "0".

While the result of the judgement is "No", the next step S05 is skipped and the routine proceeds to step S6 on. On the other hand, when "Yes", at step S05, all of the U-phase switches (S11) to (S20) which were on at that time are turned off to prevent the current Iu from flowing to the U-phase coils 111(U) . . . , 112(U) . . . and the routine proceeds to step S06. At step S06, it is judged if all of the V-phase switches (S01) to (S10) had been off in the previous loop. When the result of judgement is "Yes", all of the V-phase switches (S01) to (S10) are already off, so the routine proceeds as is to step S09. If the V-phase switches (S01) to (S20) are not all off, it is judged at step S07 if the V-phase current Iv is "0". While the result of judgement is "No", the next step S08 is skipped and the routine proceeds to step S9 on. When "Yes", all of the V-phase switches (S01) to (S20) which are on at that time are turned off and the routine proceeds to step S09. At step S09 to step S11, similar processing is performed for the W-phase and the current Iw is controlled so as not to flow to the W-phase coils 111(W), 112(W). The switches (S1) to (S30) of the U-phase, V-phase, and W-phase are turned off when the values of the currents Iu, Iv, and Iw become "0" in the above way so as to improve the transient characteristic from the powering to interruption of the coils of the first row of coils 111, 111 . . . and second row of coils 112, 112 . . .

Next, an explanation will be given of the processing for making the movable member 120 move in the positive direction (step S13 to step S22). In this processing, first, at step S13, the switches (S01) to (S20) to be turned on are determined based on the current position of the movable member 120. Here, the switches (S01) to (S20) able to be turned on are switches connected to the "coils to be powered" determined by the first method and second method. At the next step S14, first, it is judged if the U-phase switches (S11) to (S20) to be turned on in the current loop are already on. When the result of judgement is "Yes", the routine proceeds as is to step S17.

On the other hand, when the U-phase switches (any of S11 to S20) able to be turned on do not match the switches already turned on, at step S15, it is judged if the U-phase current Iu is "0". While the result of judgement is "No", the next step S16 is skipped and the routine proceeds to step S17 on. When "Yes", the routine proceeds to step S16. At step S16, the switches which are newly able to be turned on among the then off U-phase switches (S11 to S20) are turned on and the switches to be newly turned off among the then on U-phase switches (S11 to S20) are turned off. Due to this, the W-phase current Iu flows only to the W-phase coils 111(W) . . . , 112(W) . . . supposed to be turned on. Similar processing is performed for the V-phase at the next step S17 to step S19 and for the W-phase at the next step S20 to step S22 so as to turn the switches able to be turned on and the switches not able to be off.

When turning the switch (S01) to switch (S30) from on to off or from off to on as explained above, they are switched when the values of the currents Iu, Iv, and Iw have become "0" so as to improve the transient characteristic from interruption to powering of the coils 111, 111 . . . , 112, 112 . . . Further, in the processing for making the movable member 120 move in the negative direction (step S23 to step S32) as well, first, at step S23, the switches (S01) to (S30) to be turned on are determined based on the current position of the movable member 120. The method of determining the switches (S01) to (S30) to be turned on may also be either of the above first method and second method.

At the next step S24 to step S26, processing is performed to switch the desired switches (S11) to (S20) of the U-phase from on to off or from off to on so as to make the movable member 120 move in the negative direction. Further, the switches (S11) to (S20) are switched on by a routine substantially the same as that of the above step S14 to step S16. Similar processing is performed for the V-phase at the next step S27 to step S29 and for the W-phase at the next step S30 to step S32 so as to actually turn the switches (S01) to (S10) and switches (S21) to (S30) from on to off or from off to on.

Second Embodiment

Figure 15:
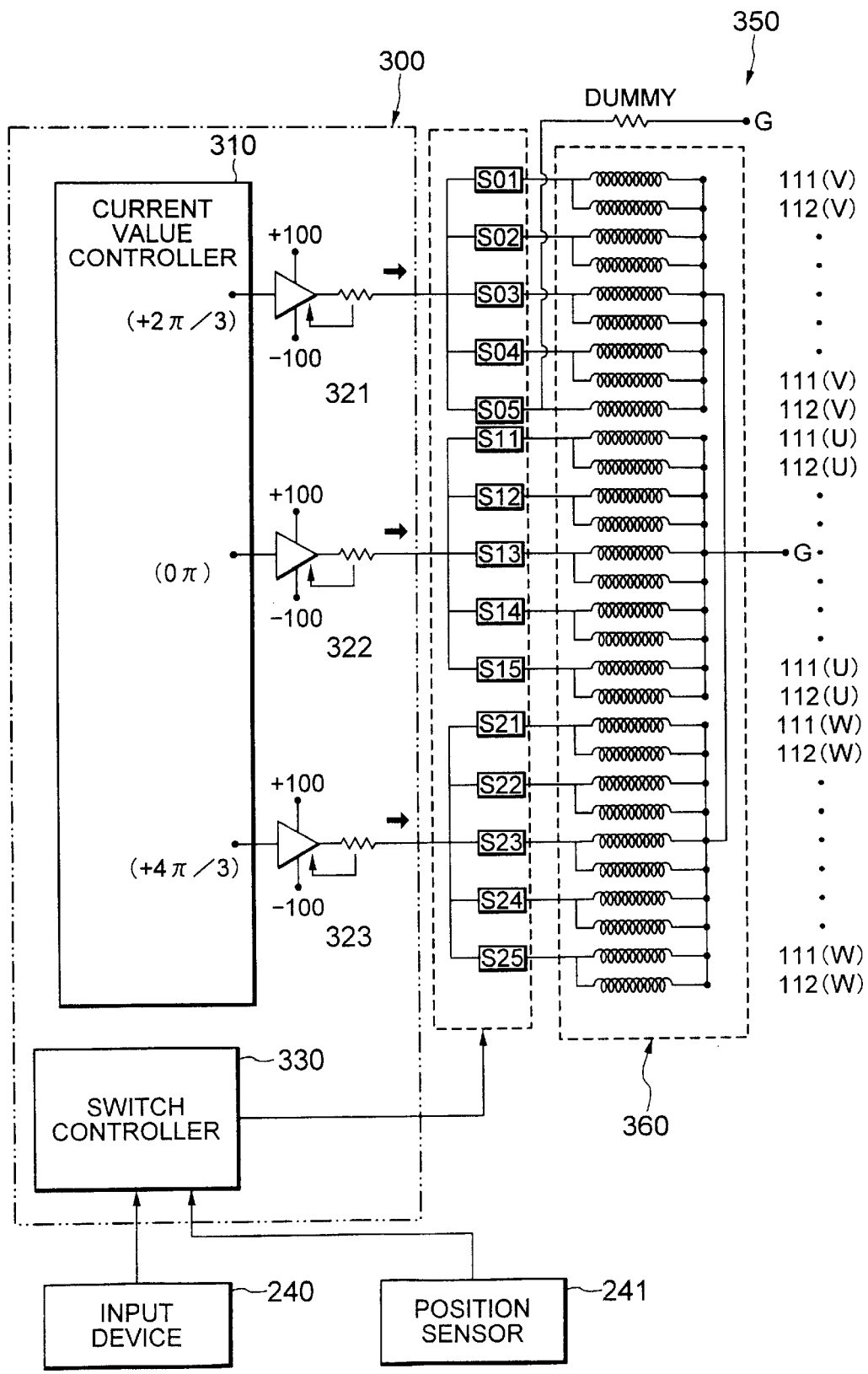
FIG. 15 is a circuit diagram of a linear motor of a second embodiment of the present invention and a controller for controlling its operation.

Next, an explanation will be given of a second embodiment of the present invention using FIG. 15. The linear motor 350 of the second embodiment differs from that of the first embodiment in the arrangement of the coils 111, 111 . . . , 112, 112 . . . in the movable member 360 and the arrangement of the switches (S01) to (S05), (S11) to (S15), and (S21) to (S25) connected to the same. That is, in the linear motor 350, to reduce the number of wires led out from the housing 113 (see FIG. 3A and FIG. 3B) for water-tightly sealing the coils 111, 112, the first row of coils 111 and second row of coils 112 in the U-phase group of coils 111(U) and 112(U), V-phase group of coils 111(V) and 112(V), and W-phase group of coils 111(W) and 112(W) are connected in parallel and a single switch is provided between the parallel connected coils 111 and 112 and controller 300. Due to this, the number of the wires led out from the housing 113 to the outside can be cut in half. As a result, the water-tightness of the housing 113 is enhanced and the cooling efficiency is improved.

The rest of the structure of the linear motor 350 of the second embodiment and the routine for control of the operation of the switches (S01) to (S05), (S11) to (S15), and (S21) to (S25) are substantially the same as those of the linear motor 100 of the first embodiment explained above. A detailed explanation will be omitted. The explanation was given of the case of connecting the first row of coils 111 and the second row of coils 112 in parallel, but serial connection is also possible. In this case as well, the number of wires can be reduced.

Third Embodiment

Figure 16:
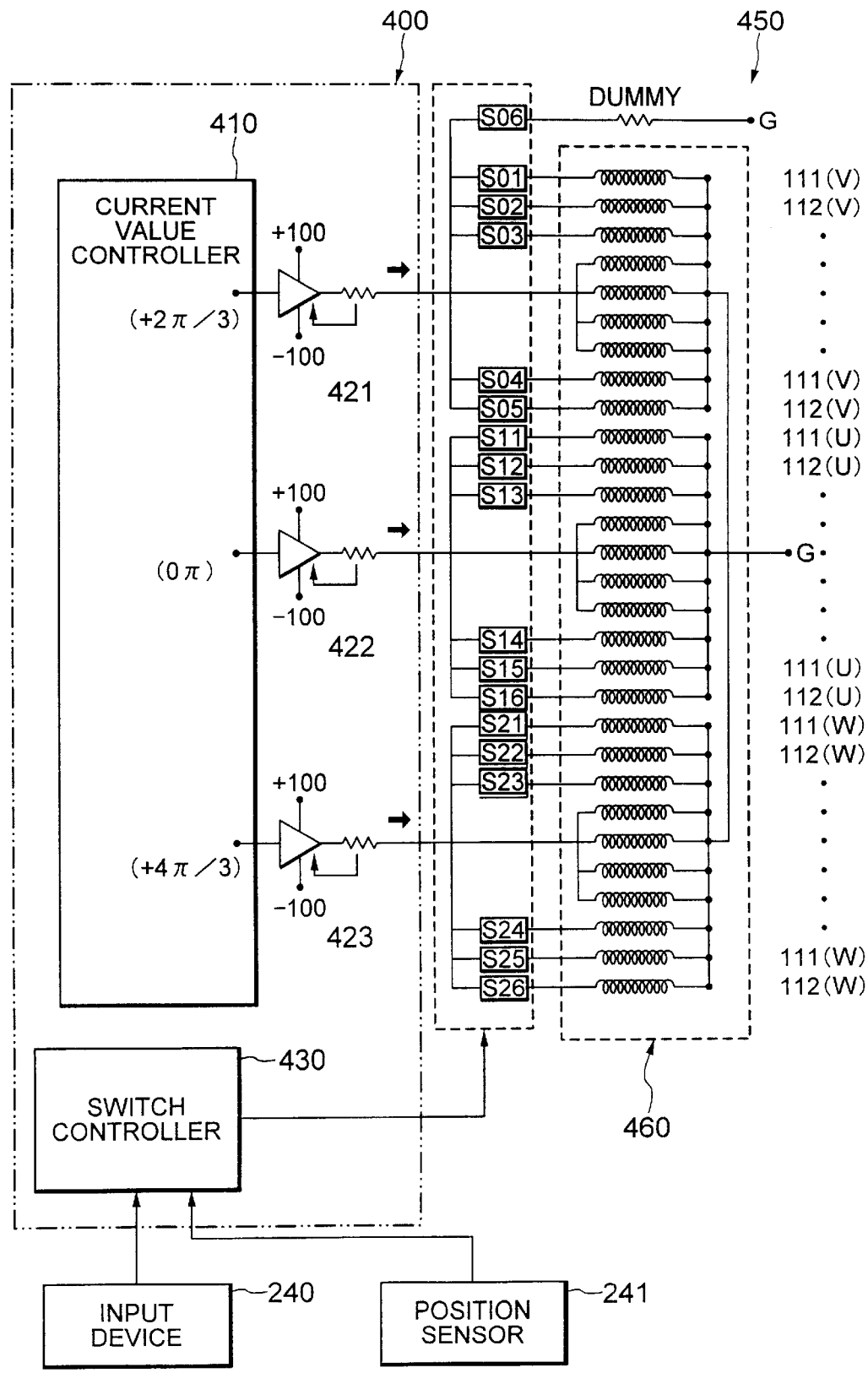
FIG. 16 is a circuit diagram of a linear motor of a third embodiment of the present invention and a controller for controlling its operation.

Next, an explanation will be given of a third embodiment of the present invention using FIG. 16. The linear motor 450 of the third embodiment differs from that of the first embodiment in the arrangement of the switches (S01) to (S06), (S11) to (S15), and (S21) to (S25) interposed between the coils 111, 111 . . . , 112, 112 . . . in the movable member 460 and the controller 400. The linear motor 450 is also designed to reduce the number of wires led out from the housing 113 (see FIG. 3A and FIG. 3B). That is, in the third embodiment, the coils positioned at a predetermined area (here, the center part) of the stator 460 among the coils 111, 111 . . . , 112, 112 . . . (in FIG. 16, the four at the center of the V-phase, U-phase, and W-phase groups of coils) are connected to a current value controller 410 of a controller 400 directly without going through switches.

The coils 111, . . . , 112, . . . positioned at the center are connected to the current value controller 410 at all times in this way since the center of the stator 460 is a location where there is a high probability of the movable member 460 being present in the normal state of use (for example, when the linear motor 450 is used for a stage device). In this case, while the amount of power consumed is increased slightly compared with the linear motor 100 of the first embodiment, it is possible to reduce the number of wires led out from the housing 113 and improve the cooling efficiency. Further, the on/off control can be performed more easily commensurate with the reduction of the switches (S01) to (S06), (S11) to (S15), and (S21) to (S25).

Figure 17:
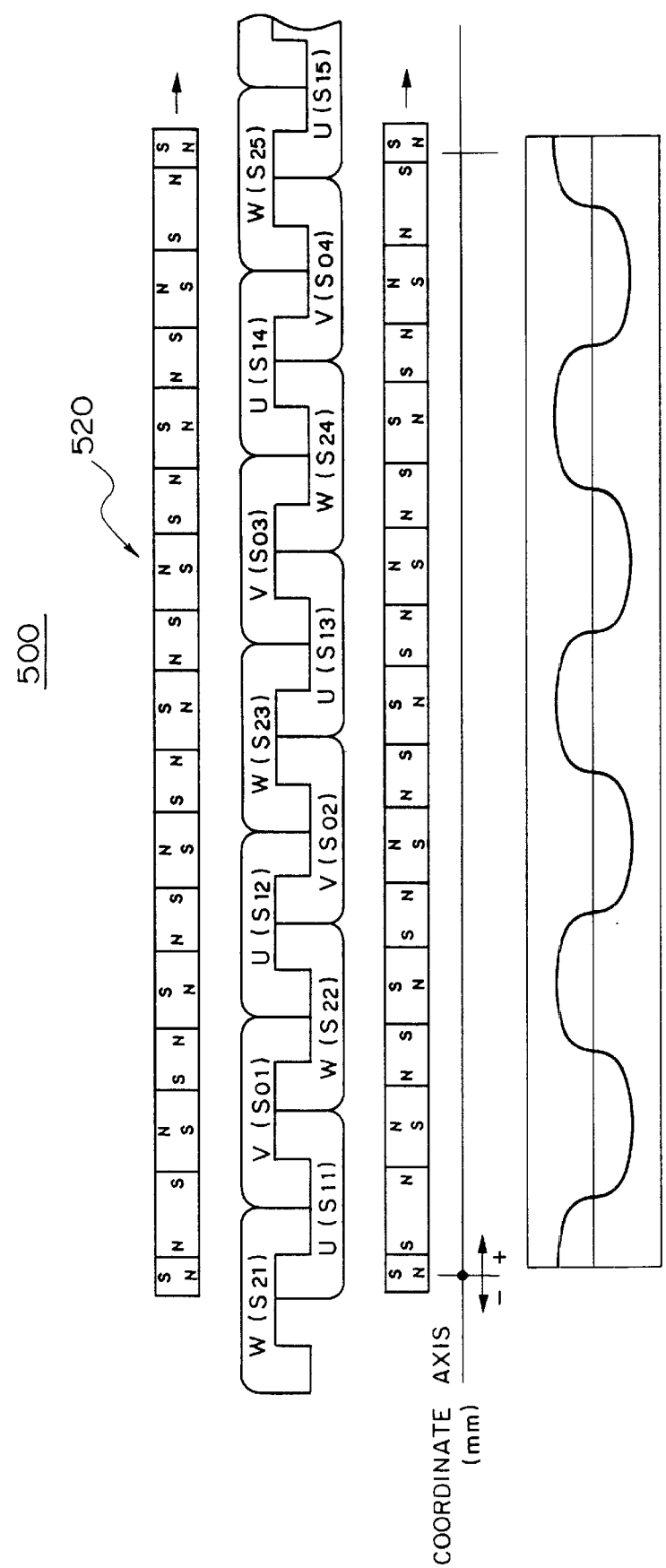
FIG. 17 is an explanatory view of a linear motor having a magnet unit having nine magnetic poles of the third embodiment of the present invention.
Figure 18:
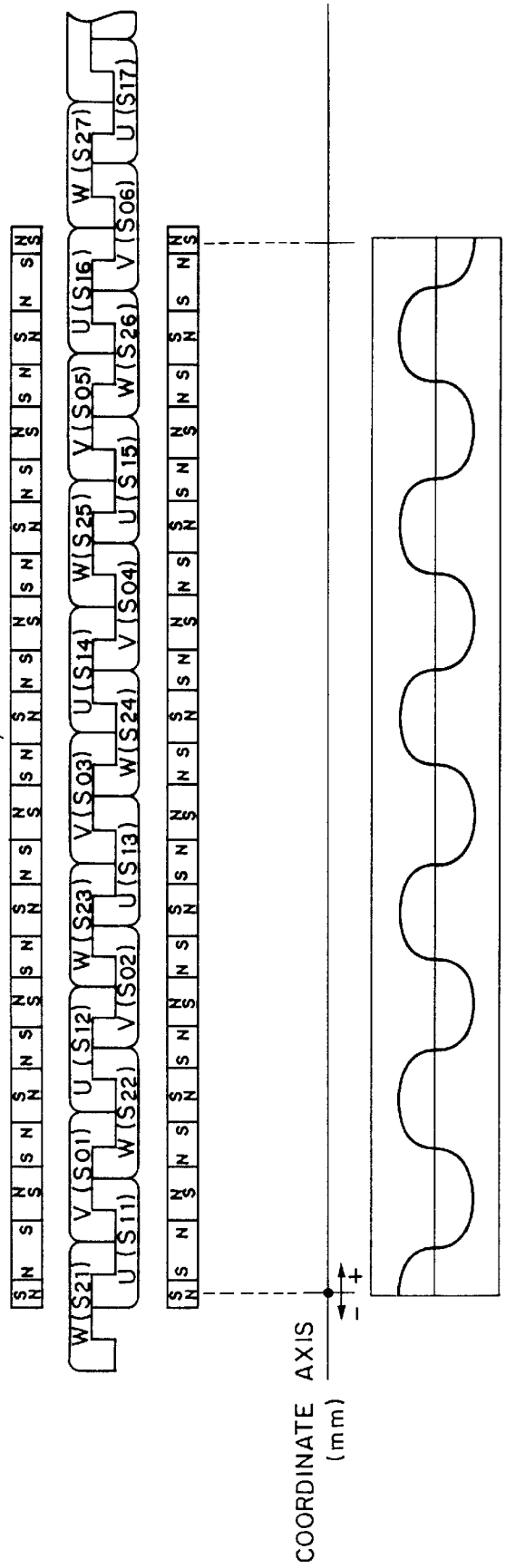
FIG. 18 is an explanatory view of a linear motor having a magnet unit having 12 magnetic poles of the third embodiment of the present invention.

The area constantly powered is not limited to the center. It is possible to power an area at all times if it is a location where there is a high probability of the movable member 460 being present. Further, in the above first to third embodiments, the explanation was given taking as an example a linear motor 100 having a movable member 120 with four magnetic poles, but of course the present invention can also be applied to a linear motor 500 having a movable member 520 with eight magnetic poles shown in FIG. 17 and further a linear motor 550 having a movable member 570 with 11 magnetic poles shown in FIG. 18. In the first to third embodiments, the explanation was given taking as an example driving the movable member 120 by powering at least the coils facing the magnet unit 120A, but it is also possible to drive the movable member 120 even by just powering at least one coil facing the magnet unit 120A.

Fourth Embodiment

Figure 19:
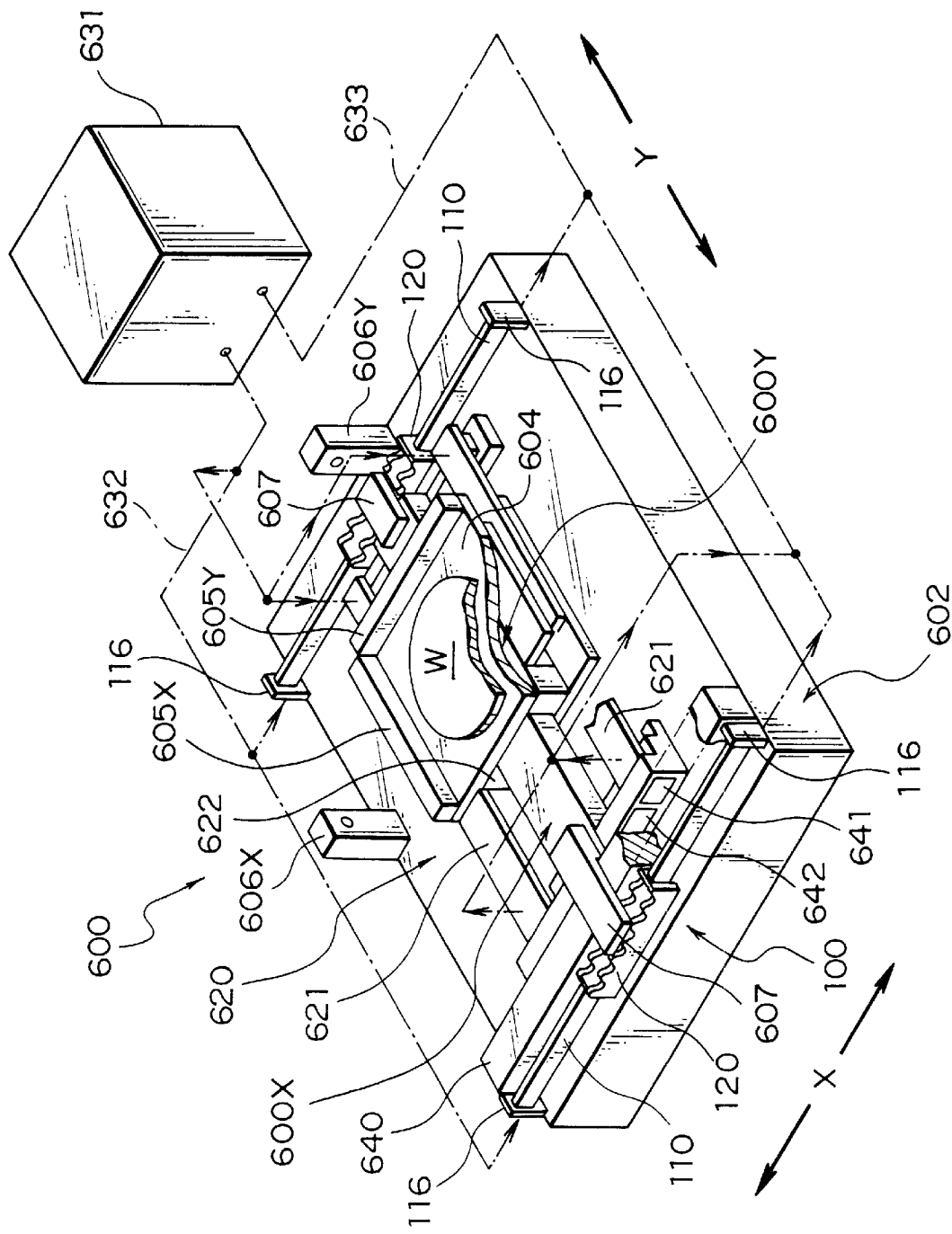
FIG. 19 is a perspective view of a stage device to which the linear motor is applied according to a first embodiment of the present invention.

Next, an explanation will be made of a fourth embodiment of the present invention using FIG. 19. The fourth embodiment is one using a linear motor (100 etc.) obtained by the first to third embodiments for a stage device 600 used for production of a semiconductor. Below, the explanation will be made taking as an example the case of building the linear motor 100 (FIG. 1) of the first embodiment into the stage device 600.

The linear motor 100 of the first embodiment had the powering/interruption of the coils 111, 111 . . . , 112, 112 . . . controlled in accordance with the position of the movable member 120, so was designed to reduce the amount Q of heat generated by the stator 110 as much as possible. That linear motor 100 had a higher motor constant. In the fourth embodiment, the linear motor 100 with the high motor constant is used to drive an X-stage (movable stage) 600X of the stage device 600. Here, when circulating a temperature regulating fluid through the coolant passage 115 between the housing 113 of the stator 110 and the coils 111, 111 . . . , 112, 112 . . . , the heat generated from the stator 110 is absorbed. Further, the configuration of two linear motors 620 used for driving a Y-stage 600Y (only one shown in FIG. 19) is the same as that of the linear motor 100. A detailed explanation will therefore be omitted.

The stage device 600 in which these linear motors 100 and 620 may be used as drive means is not particularly limited in application, but in this embodiment it is used as a drive means for a wafer W in an exposure apparatus for transferring a pattern formed on a mask (not shown) to a wafer (substrate) W. That is, the stage device 600 is a twin X-axis and Y-axis X-Y stage device which is mainly comprised of an X-stage 600X driven on a base part 602 in the X-direction (direction shown by arrow X in figure), a Y-stage 600Y driven in the Y-direction, and a sample table (movable member) 604.

Here, the sample table 604 is arranged on the Y-stage 600Y. The sample table 604 carries a wafer (substrate) W through a wafer holder (not shown). Above the wafer W is arranged a not illustrated irradiation portion. Exposure light emitted from the irradiation portion through the mask (both not illustrated) is used to transfer a circuit pattern on the mask to a resist (not shown) coated in advance on the wafer W.

The amounts of movement of the X-stage 600X and Y-stage 600Y in the stage device 600 are measured by moving mirrors 605X and 605Y fixed to an X-direction end and Y-direction end of the sample table 604 and laser interferometers 606X and 606Y fixed to the base part 602 so as to face the same. The main control system (not shown) controls movement of the sample table 604 to a desired position on the base part 602 based on the measurement results.

Further, the laser interferometers 606X, 606Y have the functions of the position sensors 241 in the first to third embodiments in the linear motor for drive in the axial directions. The outputs of the interferometers 606X, 606Y are used for control of the on/off states of the switches S01 to S30 through the switch operation controller 240 shown in FIG. 13. The X-stage 600X and the Y-stage 600Y of the stage device 600 are both driven on the base part 602 in the X-direction and Y-direction by the linear motors 100, 100, 620, 620 using stators 110 having the large number of coils 111, 111 . . . , 112, 112 . . . arranged in the axial directions.

Here, the stators 110, 110 of the two linear motors 100, 100 are fixed by mounts 116, 116 to the base part 602, while the movable members 120, 120 are fixed through fixing plates 607, 607 to the X-stage 600X.

Further, the stators 621, 621 of the linear motors 620, 620 are both fixed to the X-stage 600X, while the movable members 622, 622 (only one shown) are fixed to the Y-stage 600Y.

The stators 110, 110, 621, 621 are cooled by the temperature controlling fluid circulated through the internal passage, but the fluid is controlld in temperature by a temperature controller 631. The stator 110, 110, 621, 621 and the temperature controller 631 are connected by a discharge pipe 632, a pipe 633, etc. Further, the stage device 600 is provided with an air guide 640 and hydrostatic gas bearing (not shown). A hydrostatic air bearing type stage is comprised by an air discharge port 641 and an air suction port 642.

Fifth Embodiment

Next, an explanation will be given of a fifth embodiment of the present invention using FIG. 20. The fifth embodiment uses a linear motor (100) obtained by any of the first to third embodiments as the means for driving the reticle (mask) stage 750 of the exposure apparatus 700. In the fifth embodiment, the linear motor 100 (FIG. 1) of the first embodiment is built into a reticle stage 750. Here, the exposure apparatus 700 is a so-called step-and-scan type scanning exposure apparatus.

Figure 20:
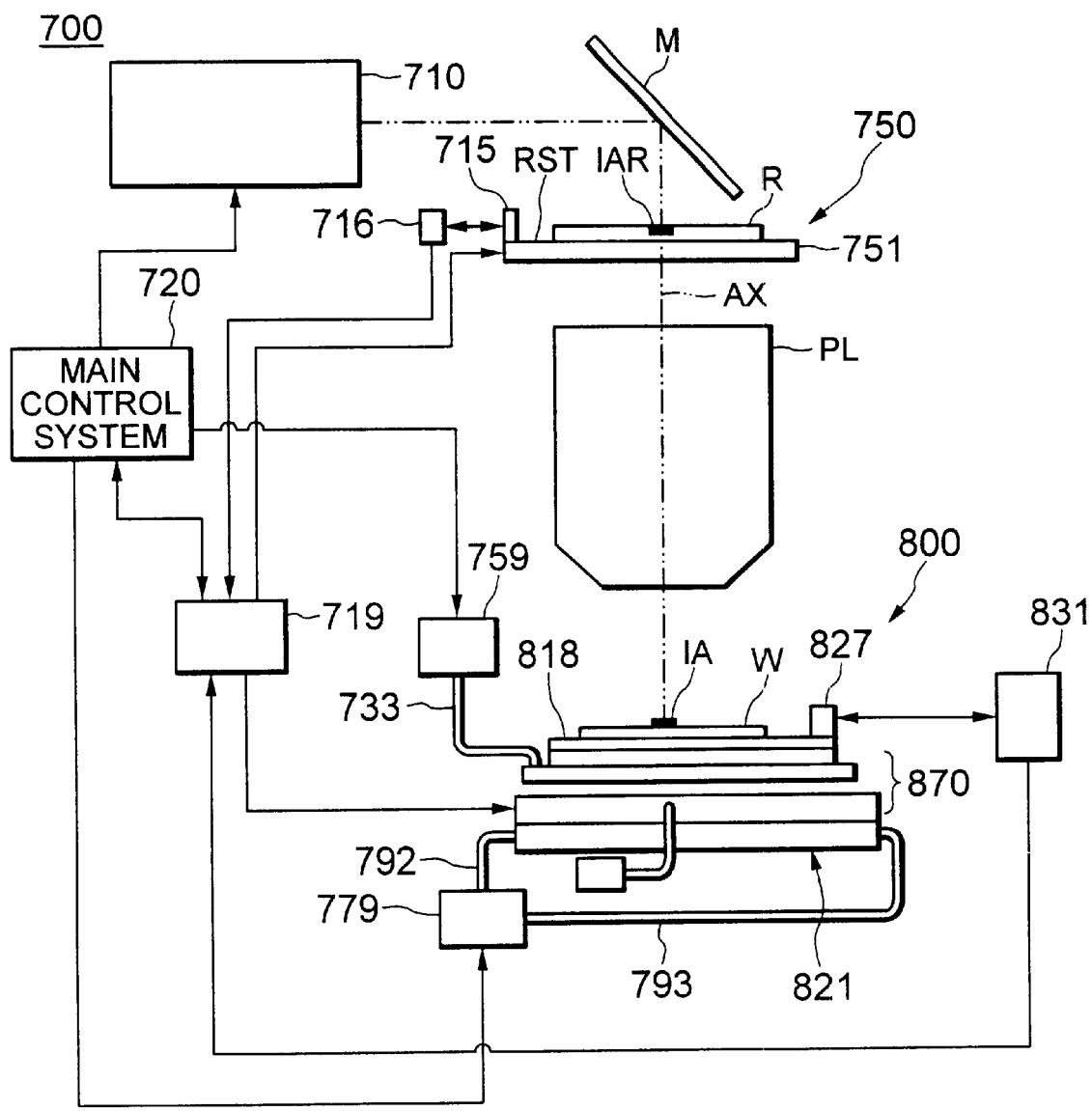
FIG. 20 is a view of the overall configuration of an exposure apparatus using a linear motor for a reticle stage according to a fifth embodiment of the present invention.

This exposure apparatus 700, as shown in FIG. 20, is provided with an illumination system 710, a stage mover 751 for holding a reticle (photomask) R, a projection optical system PL, a stage device 800 for driving a wafer (substrate) U in the X-Y plane in two directions, that is, the X-direction and Y-direction, a main control system 720 for controlling these, etc. The illumination system 710 emits exposure light emitted from a light source unit to a rectangular (or arc shaped) illumination area IAR on the reticle with a uniform brightness. Further, in the reticle stage 750, the stage mover 751 is moved on a reticle base (not shown) by a predetermined scanning speed along a guide rail (not shown). Further, the reticle R is fixed on the stage mover 751 by for example a vacuum chuck. Further, an exposure light through hole (not shown) is formed in the stage mover 751 below the reticle R.

The movement position of the stage mover 751 is detected by a reflection mirror 715 and reticle laser interferometer 716. A stage control system 719 drives a stage mover 751 in accordance with instructions from the main control system 720 based on the movement position of the stage mover 751 which is detected. Further, the projection optical system PLO is a reduction optical system and is arranged below the reticle stage 750. The direction of the optical axis AX (matching with optical axis IX of illumination optical system) is made the Z-axial direction. Here, a refraction optical system comprised of lens elements arranged at predetermined intervals along the optical axis AX direction so as to form a telecentric optical array is used. Therefore, if the illumination area IAR of the reticle R is illuminated by the illumination system 710, the reduced image (partially inverted image) of the circuit pattern in the illumination area IAR of the reticle R is formed on an exposure area IA conjugate with the illumination area IAR on the wafer W.

Further, a stage device 800 drives a table 818 in the X-Y plane in two directions using as a drive means a planar motor 870 using a coil as an armature. That is, the stage device 800 is provided with a base part 821, a table 818 floating about the top surface of the base part 821 by a clearance of several microns, and a planar motor 870 for making the table 818 move. Here, the table 818 has a wafer (substrate) W fixed to its top surface by a vacuum chuck at the time of exposure. Further, a moving mirror 827 is fixed to the table 818, a laser beam is emitted from a wafer interferometer 831, and the movement position of the table 818 in the X-Y plane is detected.

The information of the movement position detected at this time is sent through the stage control system 719 to the main control system 720. Further, the stage control system 719 operates the planar motor 870 in accordance with instructions from the main control system 720 based on this information to make the table 818 move to a desired position in the X-Y plane.

The table 818 is supported by three different points on the top surface of a movable member (not shown) constituting the plane motor 870 by a support mechanism (not shown). It is designed to be able to be not only driven in the X-direction and Y-direction, but also tilted with respect to the X-Y plane and driven in the Z-axial direction (upward). Further, the planar motor 870 is of a known configuration. Further explanation of the planar motor 870 will be omitted. Further, in the figure, reference numeral 821 is a base part. A fluid for preventing a rise in temperature due to the heat generated from inside it is circulated by the action of a supply pipe 792, discharge pipe 793, and temperature controller 779.

In the exposure apparatus 700 including a reticle stage 750 of this configuration, generally exposure is performed by the following routine. First, the reticle R and wafer W are loaded, then lenses aligned, the base line measured, alignment measured, etc. After the alignment finishes being measured, a step-and-scan type exposure operation is performed.

In the exposure operation, the main control system 720 issues instructions to the stage control system 719 based on the positional information of the reticle R from the reticle interferometer 716 and the positional information of the wafer W from the wafer interferometer 831. The linear motors 100, 100 of the reticle stage 750 and the planar motor 870 make the reticle R and wafer 9 move synchronously for the desired scanning exposure. Further, the reticle interferometer 716 has the function of a position sensor 241 in the first to third embodiments. The output from the reticle interferometer 716 is used for the control of the on/off states of the switches S01 to S30 through the switch operation controller 240 shown in FIG. 13.

When the reticle pattern finishes being transferred to the one shot area, the table 818 is stepped by exactly the amount of one shot area and then the next shot area is scan exposed. This step and scan exposure is successively repeated to transfer the patterns of the necessary number of shots on to the wafer 9.

Here, in the reticle stage 750, three phases of current are suitably supplied to the coils 20, 20 . . . comprising the stators 110, 110 of the linear motors 100, 100 for control of the amounts of movement. The reticle stage 750 of the exposure apparatus 700 has a large thrust and does not consume an excess amount of power. Further, a semiconductor device is produced using the stage device 600 or exposure apparatus 700 of the fourth embodiment or fifth embodiment of the present invention by the routine shown in FIG. 21 and FIG. 22. That is, the semiconductor device is produced by a step of design of the functions and performance of the device, a step of fabrication of the reticle based on the design step, a step of fabricating a wafer from a silicon wafer, a step of transferring to the wafer a pattern of the reticle by the exposure apparatus of the above embodiments, a step of assembling the device (including dicing, bonding, and packaging), a step of inspection, etc.

Figure 21:
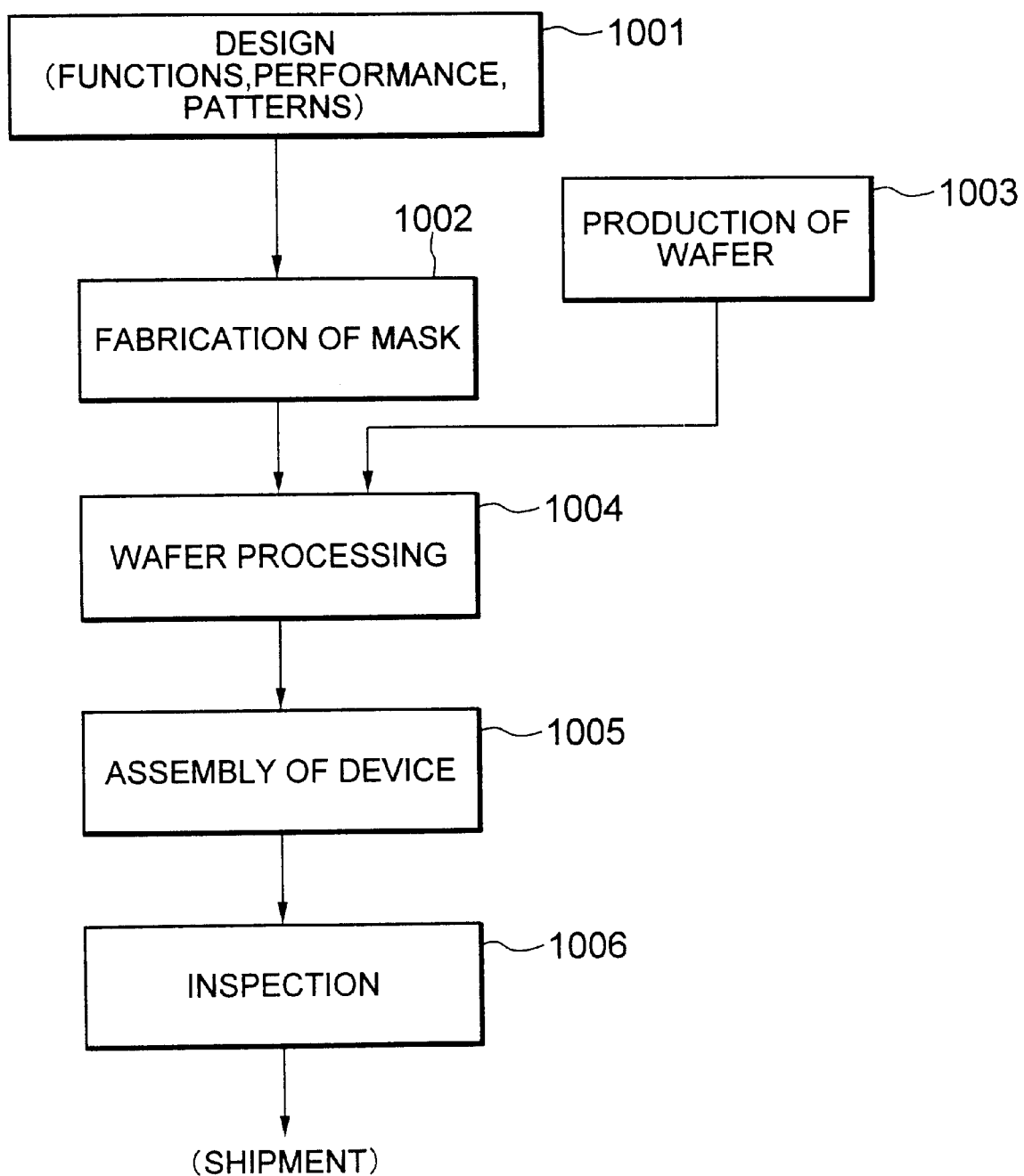
FIG. 21 is a view of a process of production of a semiconductor device using an exposure apparatus according to the present invention.

Next, the process of production of a device will be explained in further detail. FIG. 21 is a flow chart of an example of production of a device (IC or LSI or other semiconductor chip, liquid crystal panel, CCD, thin film magnetic head, micromachine, etc.) As shown in the figure, first, at step 1001 (design step), the functions and performance of the device are designed (for example, the circuit of the semiconductor device is designed) and a pattern is designed to realize those functions. Next, at step 1002 (mask fabrication step), a mask (reticle) formed with the designed circuit pattern is fabricated. On the other hand, at step 1003 (wafer fabrication step), a wafer is fabricated using silicon or another material.

Next, at step 1004 (wafer processing step), the mask (reticle) and wafer prepared at step 1001 to step 1003 are used to form the actual circuit etc. on the wafer by photolithography. Next, at step 1005 (device assembly step), the wafer processed at step 1004 is used to assemble the device. Step 1005 includes dicing, bonding, packaging (chip sealing), etc. in accordance with need. Finally, at step 1006 (inspection step), the device fabricated at step 1005 is tested to check its operation, tested for endurance, and otherwise inspected. With the end of these steps, the device is completed and shipped out.

Figure 22:
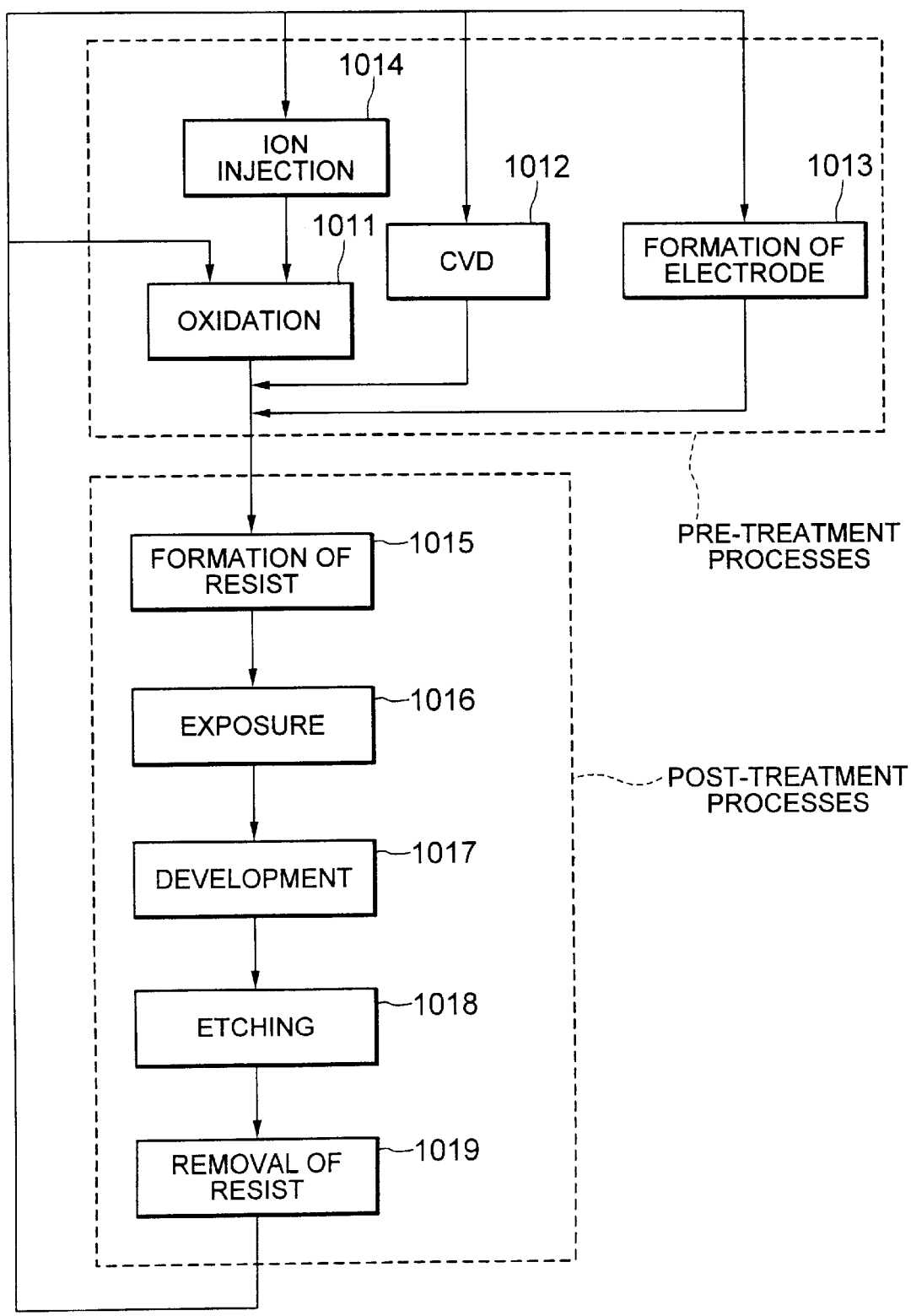
FIG. 22 is a more detailed view of the process of production of a semiconductor device using an exposure apparatus according to the present invention.

FIG. 22 shows a detailed example of the flow of step 1004 in the case of a semiconductor device. In FIG. 22, at step 1011 (oxidizing step), the surface of the wafer is oxidized. At step 1012 (CVD step), an oxide insulating film is formed on the wafer surface. At step 1013 (electrode forming step), electrodes are formed by vapor deposition on the wafer. At step 1014 (ion implantation step), ions are implanted into the wafer. The above step 1011 to step 1014 constitute pre-treatment steps of the stages of wafer processing and are selected and executed in accordance with the processing required in those stages.

In the stages of the wafer process, after the above pre-treatment steps end, post-treatment steps are performed in the following way. In the post-treatment steps, first, at step 1015 (resist formation step), a photosensitizing agent is coated on the wafer. Next, at step 1016 (exposure step), the exposure apparatus explained above is used to transfer the circuit pattern of a mask to the wafer. Next, at step 1017 (development stage), the exposed wafer is developed. At step 1018 (etching step), exposed portions, that is, parts other than those where the resist remains, are removed by etching. Next, at step 1019 (resist removal step), the resist becoming unnecessary after the etching is removed. By repeating these pre-treatment steps and post-treatment steps, a circuit pattern is formed in layers on the wafer.

Sixth Embodiment

Figure 23:
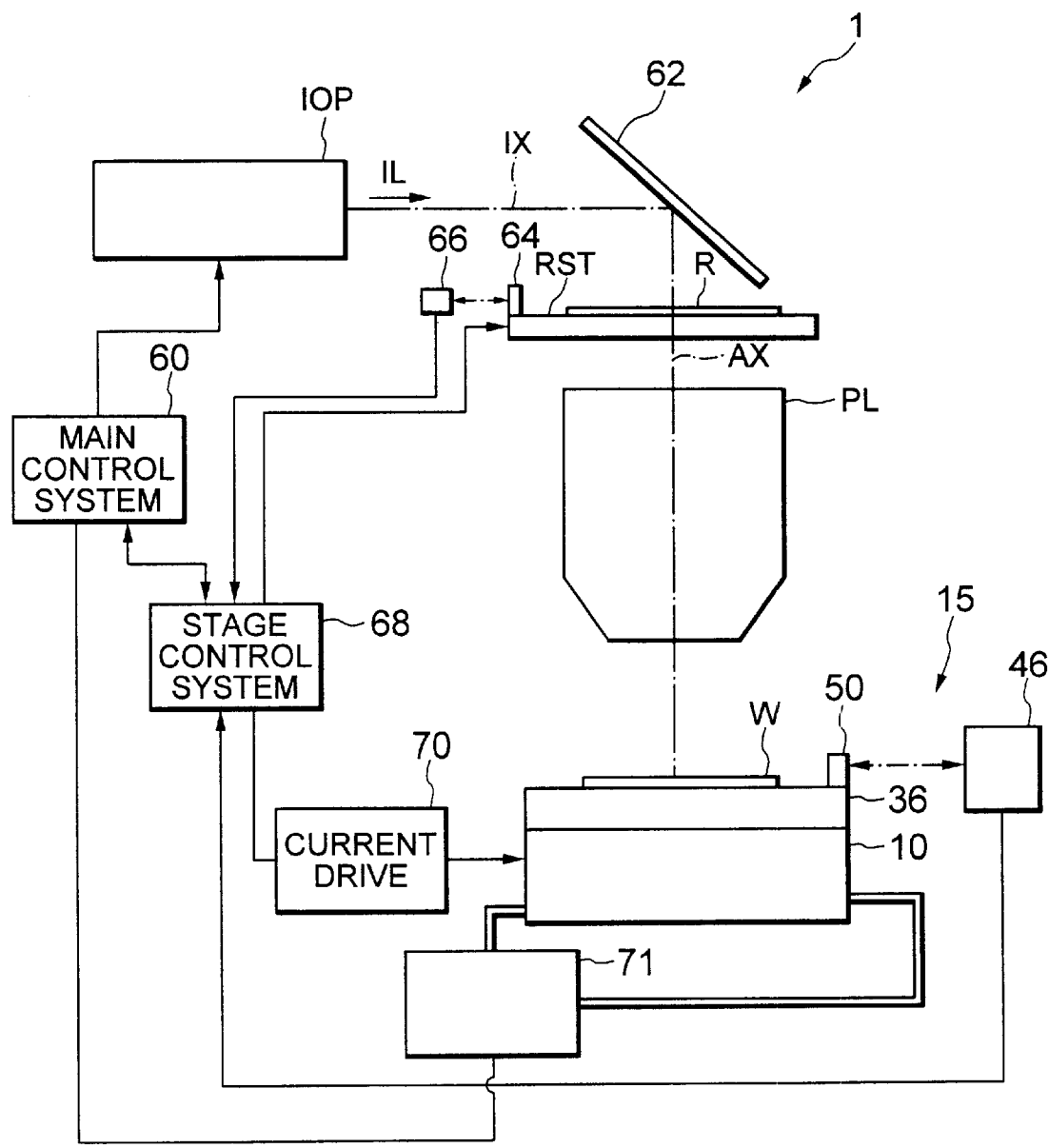
FIG. 23 is a schematic view of the configuration of an exposure apparatus according to a sixth embodiment of the present invention.

Next, an explanation will be given of a sixth embodiment of the present invention based on the drawings. FIG. 23 schematically shows the overall configuration of the exposure apparatus 1 according to the present embodiment. Further, the exposure apparatus 1 is a so-called step-and-scan type projection exposure apparatus.

The exposure apparatus 1 is provided with an illumination optical system IOP, a reticle stage RST for holding a reticle R, a projection optical system PL, a wafer stage device 15 serving as the stage device for driving a wafer W in the XY plane in the X- and Y-directions, and their control systems. The illumination optical system IOP is comprised of a light source unit, shutter, secondary light source forming optical system, beam splitter, condensing lens system, reticle blind, and imaging lens system etc. (all not shown). The configuration of the illumination optical system IOP etc. are disclosed in for example Japanese Unexamined Patent Publication (Kokai) No. 9-320956. The illumination light IL output from the illumination optical system IOP is reflected at a bending mirror 62, then illuminates a rectangular illumination area on the reticle R held on the reticle stage RST.

A reticle R is fixed on the reticle stage RST by for example a vacuum chuck. A moving mirror 64 for reflecting a laser beam from a reticle laser interferometer (hereinafter called a "reticle interferometer") 66 is fixed on the reticle stage RST. The position of the reticle stage RST in the plane of stage movement is detected at all times by the reticle interferometer 66 by a resolution of for example about 0.5 to 1 nm. Positional information of the reticle stage RST from the reticle interferometer 66 is sent to the stage control system 68 and the main control system 60 through this. The stage control system 68 drives the reticle stage RST through a reticle drive system (not shown) based on positional information of the reticle stage RST in response to instructions from the main control system 60.

The projection optical system PL is arranged below the reticle stage RST in FIG. 23. The direction of its optical axis AX (matching with optical axis IX of illumination optical system) is made the Z-axial direction. Here, a refraction optical system comprised of lens elements arranged at predetermined intervals along the optical axis AX direction so as to form a double-sided telecentric optical array is used. The projection optical system PL is a reduction optical system having a predetermined projection magnification, for example, ⅕ (or ¼). Therefore, if the illumination area of the reticle R is illuminated by the illumination light IL from the illumination optical system, the illumination light IL passing through the reticle R causes a reduced image (partially inverted image) of the circuit pattern in the illumination area to be formed through the projection optical system PL on an exposed area conjugate with the illumination area on the wafer W coated with a photoresist on its surface.

Figure 24:
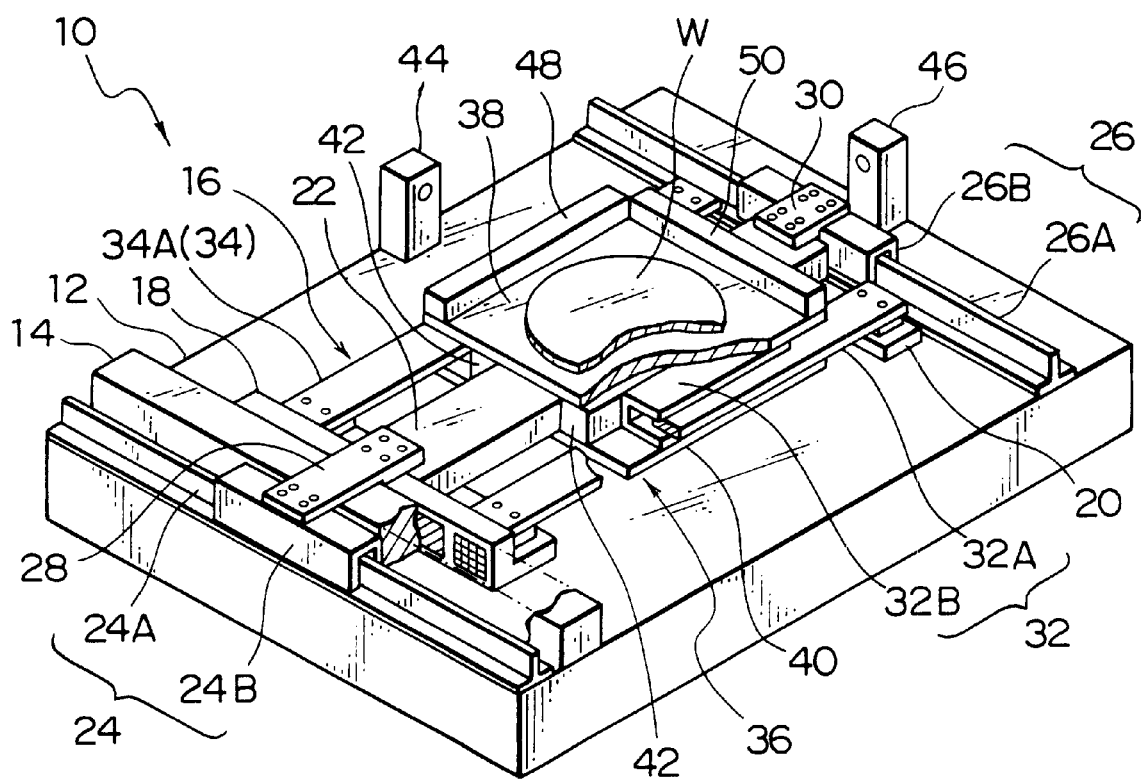
FIG. 24 is a perspective view of the detailed configuration of a wafer stage device of the apparatus of FIG. 23.

The wafer stage device 15 is comprised of a drive system 10 and a wafer stage 36 as the stage. The drive system 10, as shown in FIG. 24, is provided with a platen 12, an X-guide 14 serving as a guide bar fixed on the platen 12, a moving member 16 able to move on the surface of the platen 12 in the X-direction along the X-guide 14, and a Y-guide 22 serving as a movement guide of the moving member 16. As the platen 12, for example, an alumina ceramic rectangular one, which is lighter in weight and harder to scratch compared with iron, is used. The top surface of the platen 12 is made the reference plane. As the X-guide 14, for example, one made of alumina ceramic is used. The X-guide 14 is arranged along the X-direction near one end of the platen 12 in the Y-direction. Further, the surface at the other end of the X-guide 14 in the Y-direction is made the reference plane.

The moving member 16 comprises a first Y-guide carrier 18 comprised of an L-shaped channel arranged on the platen 12 along the X-direction in proximity to the X-guide 14, a second Y-guide carrier 20 comprised of a narrow strip arranged on the platen 12 in parallel to the first Y-guide carrier 18 a predetermined distance away from the first Y-guide carrier 18, and a Y-guide 22 extending in the Y-direction laid between the first and second Y-guide carriers 18 and 20.

At one side of the X-guide 14 on the platen 12 in the Y-direction, an armature unit 24A serving as the stator of a first X-linear motor 24 extends in the X-direction in proximity to the X-guide 14. Further, at the other side of the Y-guide carrier 20 in the Y-direction in proximity to the other end of the platen 12 in the Y-direction, an armature unit 26A serving as the stator of a second X-linear motor 26 is provided extending in the X-direction. In the present embodiment, so-called moving magnet type linear motors are used as the first and second X-linear motors 24 and 26.

A magnet unit 24B serving as the movable member of the first X-linear motor 24 is connected to one end of the Y-guide 22 through a connecting member 28, while a magnet unit 26B serving as the movable member of the second X-linear motor 26 is connected to the other end of the Y-guide 22 through a connecting member 30. Therefore, the moving member 16 is designed to be driven in the X-direction by movement of the magnet units 24B, 26B of the first and second X-linear motors 24, 26.

Armature units (stators) 32A, 34A of the first and second Y-linear motors 32, 34 are arranged along the Y-direction at one side and another side of the Y-guide 22 in the X-direction and span the first and second Y-guide carriers 18, 20. In FIG. 24, however, illustration of the magnet unit of the second Y-linear motor of the rear side is omitted. Moving magnet type linear motors are used as the first and second Y-linear motors as well.

The wafer stage 36 is comprised of a top plate 38 and bottom plate 40 arranged substantially in parallel to each other in a state sandwiching the Y-guide 22 from the top and bottom and in parallel to the top surface (reference plane) of the platen 12 and a pair of Y-direction bearings 42, 42 connecting these top plate 38 and bottom plate 40 at the two sides of the Y-guide 22. These Y-direction bearings 42, 42 are arranged in parallel to the Y-guide 22 in the state forming predetermined clearances with the Y-guide 22. At the outer surfaces of the these Y-direction bearings 42, 42 are attached the magnet units (stators) 32B, 34B (however, 34B is not shown) of the first and second Y-linear motors 32, 34 comprising the drive means of the wafer stage 36. The wafer stage 36 is designed to be driven in the Y-direction by the movement of the magnet units 32B, 34B of the Y-linear motors 32, 34. Further, at the inside surface of the Y-direction bearings 42 is provided a not shown air blower. Further, the dimensions of these Y-direction bearings 42 in the height direction are set larger than those of the Y-guide 22.

The top plate 38 also serves as the substrate table. On the top surface of the top plate 38 are carried an X-moving mirror 48 and Y-moving mirror 50 reflecting laser light emitted from an X-coordinate measurement laser interferometer 44 and Y-coordinate measurement laser interferometer 46 fixed on the platen 12 and a wafer W. Further, the wafer W is actually carried on the top plate 38 through a not shown Z-leveling stage enabling vertical (Z-direction) movement and rotation around the X-, Y-, and Z-axes. Further, the position of the top plate 38 in the plane of stage movement is constantly detected by the X-coordinate measurement laser interferometer 44 and Y-coordinate measurement laser interferometer 46 by a resolution of about for example 0.5 to 1 nm.

Returning to FIG. 23, positional information of the top plate 38 from the X-coordinate measurement laser interferometer 44 and Y-coordinate measurement laser interferometer 46 (not shown in FIG. 23, see FIG. 24) is sent to the stage control system 68 and the main control system 60 through this. The stage control system 68 adjusts the direction and size of the current supplied to the armature units 24A, 26A, 32A, and 34A from a current control system 70 based on the positional information of the top plate portion 38 in response to instructions from the main control system 60 so as to control the wafer stage device 15.

If current is supplied from the current drive system 70 to the armature units 24A, 26A, 32A, and 34A for control of the wafer stage device 15, the armature units 24A, 26A, 32A, and 34A generate heat. Therefore, to cool the armature units 24A, 26A, 32A, and 34A, a coolant (water (pure water) or Fluorinate (Sumitomo 3M, fluorine-based inert liquid) etc.) is supplied from a cooling controller 71 to the wafer stage device 15. Further, the coolant used for the cooling is returned from the wafer stage device 15 to the cooling controller 71 where it is cooled by the cooling controller 71, then again supplied to the wafer stage device 15. It is not however absolutely necessary to provide such a path for circulation of the coolant. It is also possible to discharge the coolant to the outside after absorbing the heat.

Further, the wafer stage device 15 is provided with a vacuum type hydrostatic air bearing provided with air jet ports and vacuum ports at various locations. A not shown air pump for controlling the air pressure is connected to the wafer stage device 15.

Further, the apparatus of FIG. 23 is provided with a multi-point focal position detection system (not shown), one of the oblique incidence type focus detection systems (focus detection systems) for detecting the portion of the surface of the wafer W in the exposure area and the position of the area near it in the Z-direction (optical axis AX direction). The detailed configuration etc. of the multi-point focal position detection system are disclosed in for example Japanese Unexamined Patent Publication (Kokai) No. 6-283403.

In the exposure apparatus 1 of the present embodiment configured as explained above, the reticle R is illuminated by a slit-shaped illumination area having a longitudinal direction in a direction perpendicular to the scanning direction of the reticle R. By having the reticle R and wafer W move synchronously in opposite directions to each other, the pattern formed on the pattern area of the reticle R as a whole is transferred by an accurate projection magnification at the shot area of the wafer W.

Next, an explanation will be given of the linear motors 24, 26, 32, and 34 carried on the wafer stage device 15 shown in FIG. 24 with reference to FIG. 25, FIG. 26A to FIG. 26C, and FIG. 27A to FIG. 27C. Further, the linear motors 24, 26, 32, and 34 are configured in the same way, so below the explanation is given taking as an example the linear motor 24.

Figure 25:
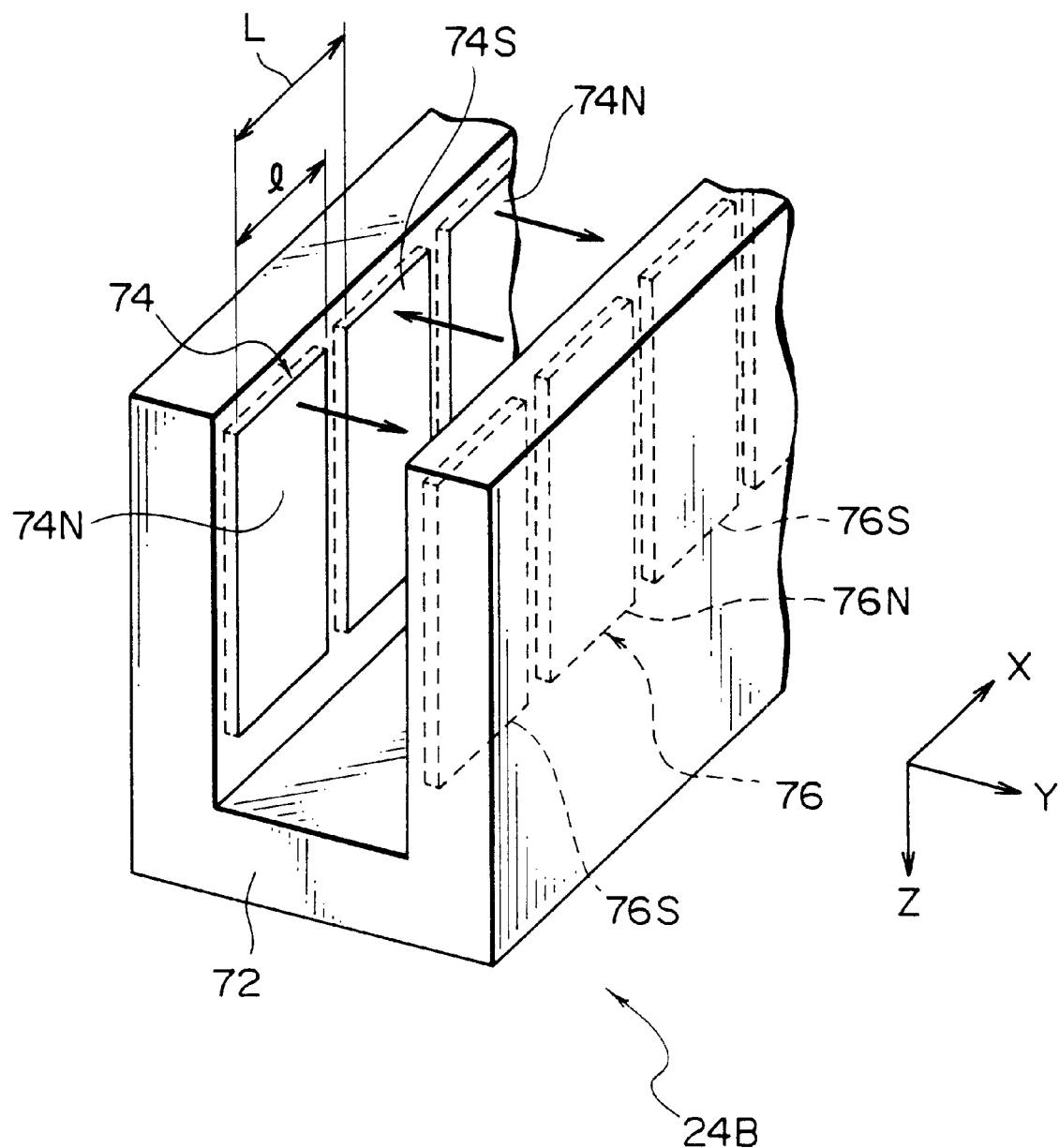
FIG. 25 is a perspective view of the schematic configuration of a magnet unit of a linear motor used for the wafer stage device of FIG. 24.

As explained above, the linear motor 24 is comprised of an armature unit 24A serving as a stator and a magnet unit 24B serving as a movable member. The magnet unit 24B, as shown in FIG. 25, is comprised of a magnetic pole base 72 comprised of a magnetic material, having U-shaped ends, and extending in the stroke direction (X-axial direction), a group of field magnets 74 embedded at one side of inner walls facing each other across the space of the magnetic pole base 72, and a group of field magnets 76 embedded in the other side of the inner walls facing each other.

Here, the group of magnets 74 is comprised by field magnets 74N having exposed magnetic pole surfaces forming N poles and field magnets 74S having exposed magnetic pole surfaces forming S poles arranged alternately. Further, the exposed magnetic pole surfaces of the field magnets 74N and exposed magnetic pole surfaces of the field magnets 74S are identical rectangular shapes. The lengths (l) in the stroke direction of the magnetic pole surfaces from the sides of the rectangular shapes are defined. Further, the field magnets 74N and the field magnets 74S are arranged at spaces of lengths (L−l) in the stroke direction.

The group of field magnets 76 is comprised by field magnets 76S having exposed magnetic pole surfaces forming S poles and field magnets 76N having exposed magnetic pole surfaces forming N poles arranged alternately. Further, the exposed magnetic pole surfaces of the field magnets 76N and exposed magnetic pole surfaces of the field magnets 76S are identical rectangular shapes with the exposed magnetic pole surfaces of the field magnets 74N and exposed magnetic pole surfaces of the field magnets 74S.

Further, the field magnets 74S and field magnets 76N and the field magnets 74N and field magnets 76S are arranged to face each other across a space. Therefore, the space between the group of field magnets 74 and the group of field magnets 76 forms a field space in which an alternating field in an orthogonal direction (Y-axial direction) of the stroke direction is generated at a period L along the stroke direction. Further, the group of field magnets 74, group of field magnets 76, magnetic pole base 72, and field space constitute a magnetic circuit.

Further, in the magnet unit 24B of the present embodiment, the group of field magnets 74 and the group of field magnets 76 were embedded in the magnetic pole base 72, but it is also possible to configure the magnet unit by making the facing inner walls of the magnetic pole base 72 smooth surfaces and bonding the group of field magnets 74 and group of field magnets 76 to the facing inner walls of the magnetic pole base 72 by an adhesive etc.

The general configuration of the armature unit 24A is shown in FIG. 26A to FIG. 26C. Here, FIG. 26A is a sectional view of the armature unit 24A parallel to the XZ plane, FIG. 26B is a sectional view along the line B—B of FIG. 26A, and FIG. 26C is a sectional view along the line C—C of FIG. 26A. The armature unit 24A, as shown in FIG. 26A to FIG. 26C, is provided with an armature base 78 comprised of a non-magnetic material or a plastic etc. and a can 80 comprised of a non-magnetic material, having a shape of a hollow parallelopiped with one face open, and having the opening part fixed to the +Z-direction surface of the armature base 78.

In the closed space formed by the armature base 78 and can 80 (hereinafter referred to as the "can inside") are arranged a group of element coils 84A comprised of N number of element coils $84A_1, \ldots, 84A_N$ and a group of flat coils 84B comprised of N number of element coils $84B_1, \ldots, 84B_N$ provided at the +Y-direction side of the group of element coils 84A.

Figure 27C:
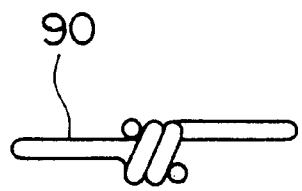
FIG. 27A to FIG. 27C are views for explaining the configuration of element coils used in the armature unit of FIG. 26A to FIG. 26C.
Figure 27A:
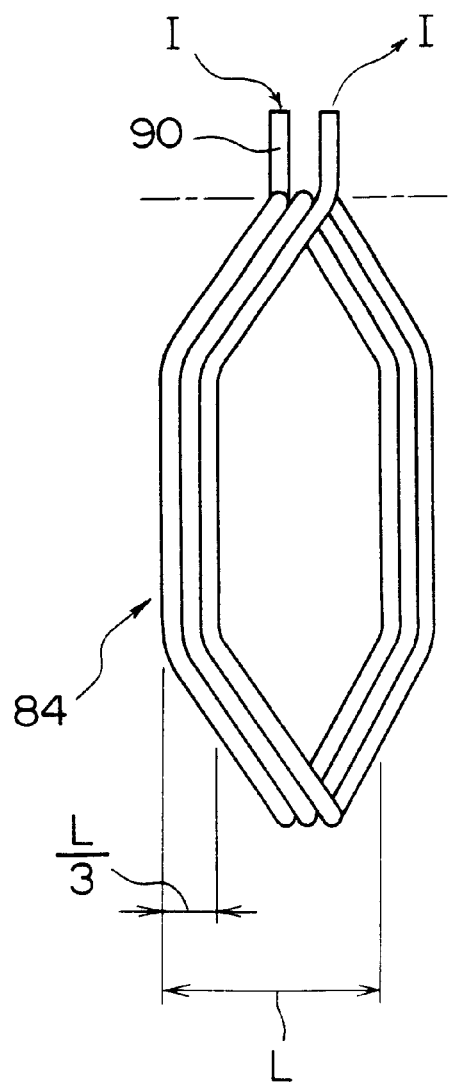
Figure 27B:
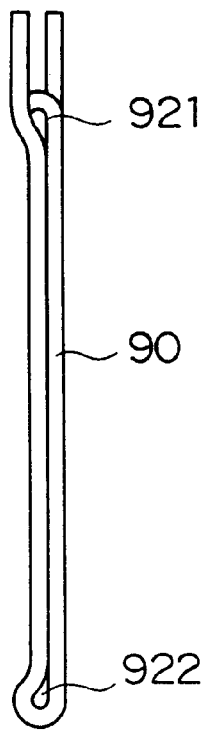

The element coils 84Ai, 84Bi (i=1 to N) (hereinafter any one being referred to as the "element coil 84") are configured in the same way. The general configuration is shown in FIG. 27A to FIG. 27C. Here, when viewing the element coil 84 from the front of the surface of FIG. 26A as the front view, that front view is shown in FIG. 27A, the right side view is shown in FIG. 27B, and the plane view is shown in FIG. 27C. Further, in FIG. 27A to FIG. 27C, the case of three turns is shown in relation to the drafting, but normally since the conductors are sufficiently thinner than L/3, the number of turns becomes sufficiently greater than 3 (for example, 10).

The element coil 84, as clear from viewing FIG. 27A to FIG. 27C viewed overall, is configured as a planar coil (flat coil), suitable for making thin apparatuses, having a hexagonal shape of a predetermined width in the front view. Explaining this in more detail, the conductor 90 is bent into a hexagon having two ends sticking up in the Z-axial direction, has a side of a length of about ⅓ of the period L of the alternating magnetic flux in the above magnet unit 24B (=L/3), and has a maximum width relating to the stroke direction (X-axial direction) of the center hollow portion of about 2L/3. Further, the element coil 84 is configured to be substantially linearly symmetrical about an axis extending in the stroke direction through the center of the coil.

As a result, if the element coil 84 is arranged in the field space generated by the alternating field of the period L formed by the magnet unit 72 along the stroke direction and current (I) is supplied from the current drive 70 to the element coil 84, only a force parallel to the stroke direction acts on the element coil as a whole as a combined force of the Lorentz forces generated at the sides. The direction and size of the force acting on the element coil 84 are determined by the direction and size of the current supplied from the current drive system 70 to the element coil 84 and the positional relationship between the element coil and the alternating magnetic field.

The element coil 84 is bent at the two ends in the Z-axial direction, but the bent portions are bent gently so as not to break the conductor 90. As a result, as shown particularly clearly in FIG. 27B, spaces 921, 922 extending in the stroke direction are formed inside. The above element coil 84 is produced by winding the coil conductor 90 to fabricate a coil with a hexagonal columnar inside, then pressing the coil to a flat shape.

Returning to FIG. 26A to FIG. 26C, the group of element coils 84A is comprised of element coils 84Ai configured in the above way arranged successively along the stroke direction so that the sides of the element coils 84Ai parallel to the Z-axis adjoin each other. Further, the group of element coils 84B, like the group of element coils 84A, is comprised of element coils 84Bi arranged successively along the stroke direction so that the sides of the element coils 84Bi parallel to the Z-axis adjoin each other.

As methods for holding element coils 84, there are (1) the method of mounting a holding plate inside the can 80 and attaching the element coil 84 to the holding plate, (2) the method of wrapping and holding the arranged element coils 84 to envelop them as a whole, (3) the method of passing wire members through the element coils to hold them, etc. In the present embodiment, (3) is used. This will be explained in detail.

As shown well by FIG. 26A to FIG. 26C, the element coils 84 are supported by a supporting wire 86A$_1$ passing through the spaces 921 of the element coils 84Ai and a supporting wire 86A$_2$ passing through the space 922 of the element coil 84Ai. First ends of the supporting wires 86A$_1$, 86A$_2$ are fixed to the can 80 through a spacer 82A, while second ends are fixed to the can 80 through a spacer 82B. Further, the group of element coils 84B, like the group of element coils 84A, is fixed at one end to the can 80 through a spacer 82A and is fixed at the other end to the can 80 through a spacer 82B.

The can 80 is provided with an inflow port 88A of the coolant (refrigerant) and discharge port 88B. The coolant is supplied from the cooling controller 71 shown in FIG. 23 through the inflow port 88A to the inside of the can 80. When passing through the inside of the can 80, heat is exchanged between the element coils 84Ai and 84Bi. The coolant absorbing the heat generated by the element coils 84Ai and 84Bi and becoming high in temperature is discharged to the outside through the discharge port 88B. In this case, the coolant discharged through the discharge port 88B is returned through the coolant passage to the cooling controller 71 where it is again cooled and fed into the can 80.

In the linear motor 24, by having the current drive system 70 control the current supplied to the element coils 84Ai and 84Bi of the armature unit 24A, the magnet unit 24B is driven by the reaction force of the Lauretz force generated at the element coils 84Ai and 84Bi. In driving the magnet unit 24B, since the width L/3 of the current path sides of the element coils 84Ai and 84Bi of the groups of element coils 84A and 84B is about ⅓ of the period L of the alternating field in the magnet unit 24B, three phases of current are supplied by the current drive 70 to the sets of three element coils of the element coils 84Ai and 84Bi successively arranged in the stroke direction.

Next, an explanation will be given of the control of the supply of current, the characterizing feature of the present embodiment, taking as an example the group of element coils 84A. FIG. 28 is a block diagram of the control system relating to the group of element coils 84A. In the present embodiment, the group of element coils 84A is divided into units 84-1, 84-2, . . . each comprised of six element coils 84Ai. The stage control system 68 is designed to change the element coils 84Ai powered in units of these units. For example, the unit 84-1 includes the element coils 84A$_1$ to 84A$_6$, the element coils 84A$_1$ and 84A$_4$ are connected in series to the U-phase of the three-phase AC power source included in the current drive 70, the element coils 84A$_2$ and 84A$_5$ are connected in series to the V-phase, and the element coils 84A$_3$ and 84A$_6$ are connected in series to the W-phase. Further, the units 84-2, 84-3, . . . are connected to the current drive system 70 in the same way as with the unit 84-1.

When the magnet unit 24B serving as the movable member moves from the element coil 84A1 to the element coil 84AN (from the left to right in FIG. 26A), first, current is supplied to the first to third units 84-1, 84-2, and 84-3. Current is supplied to the fourth unit 84-4 before the magnet unit 24B completely passes the first unit 84-1 and the supply of current to the first unit 84-1 is stopped at the stage when the magnet unit 24B completely passes the first unit 84-1. The magnet unit 24B moves further in the above direction by the fourth unit 84-4 newly supplied with current. Next, current is supplied to the fifth unit 84-5 before the magnet unit 24B completely passes the second unit 84-2 and the supply of current to the second unit 84-2 is stopped at the stage when the magnet unit 24B completely passes the second unit 84-2. The magnet unit 24B moves further in the above direction by the fifth unit 84-5 newly supplied with current. This drive operation is successively repeated so that the magnet unit 24B moves smoothly.

To make this operation more efficient, it is desirable to set the units 84-1, 84-2, . . . equal to the lengths of the magnet unit 24B in the stroke direction ((m−1)L+1 where the number of the field magnets is "m").

Since the present embodiment is designed in this way so that only selected coils in the group of element coils 84A are powered in accordance with the position of the magnet unit 24B and therefore the position of the wafer stage 36 (see FIG. 24), it is possible to greatly reduce the amount of heat generated by the coils compared with the case of constantly supplying current to the coils as a whole. The selection of the coils in accordance with the position of the wafer stage 36 may be performed based on detection values of a position detection system for detecting the position of the wafer stage 36. FIG. 28 shows a group of element coils 84A in the linear motor 24 for driving in the X-direction, so as the above position detection system, it is possible to use an X-coordinate measurement laser interferometer 44. In the linear motor 32 for driving in the Y-direction (see FIG. 24), it is possible to use the Y-coordinate measurement laser interferometer 46 as a position detection system.

By reducing the amount of heat generated in this way, in the wafer stage device 15 of this embodiment using the linear motor 24 and the linear motors 26, 32, 34 configured in the same way as sources of generation of drive force, it is possible to drive the stage by a large thrust while suppressing fluctuation in the air surrounding the wafer stage device 15 due to heat, which reduces the accuracy of the detection of position by the laser interferometer, or heat expansion of the members comprising the wafer stage device 15 itself and other members. Therefore, it is possible to move the wafer W carried on the wafer stage device 15 quickly in the XY plane and control the position of the wafer W with good accuracy. Further, according to the projection exposure apparatus 1 of the present invention configured in this way, since the wafer stage device 15 moves and positions the wafer W, the wafer can be moved and controlled in position quickly with a good precision and the pattern formed on the reticle R can be transferred to the shot area of the wafer W while improving the throughput and the exposure accuracy.

Further, in the above embodiment, linear motors of the present invention were used for the wafer stage device 15, but linear motors of the same configuration as these may also be used for a reticle stage RST. In this case, it is possible to drive the reticle stage RST by a large thrust while suppressing fluctuations in the air surrounding the reticle stage RST due to heat or the heat expansion of the members comprising the stage. Therefore, it is possible to move a reticle carried on the reticle stage RST quickly in the Y-direction and possible to control the position of the reticle R with a good accuracy. Further, in the above embodiment, flat coils were used as element coils, but it is similarly possible to use coils having winding bobbins.

In the above embodiment, the linear motors were configured as so-called moving magnet types using an armature unit as a stator and a magnet unit as a movable member, so it is possible to fix in place the cooling pipes etc. and possible to simplify the configuration of the apparatus. Further, in the above embodiment, the element coils were made hexagonal in shape, but any shapes may be used so long as they allow arrangement in the stroke direction. Further, the width of the element coils at the current path side was made ⅓ of the period of the alternating field and three phases of current were supplied, but it is also possible to improve the thrust performance even if making the width of the current path side 1/n of the period of the alternating field of the magnet unit (n being an integer of 2 or more not including 3) and supplying n phases of current.

In the above embodiment, permanent magnets were used as the field magnets of the magnet unit, but it is also possible to use electromagnets generating magnetic force lines in the same direction as the permanent magnets instead of permanent magnets. In the above embodiment, a liquid coolant was used for cooling the armature coils, but it is possible to use a gaseous coolant as well. The present invention is not limited to application to an exposure apparatus and may also be applied to the drive systems of various apparatuses and various systems using flat coils. In the above embodiment, the explanation was given of the case of dividing the element coils (group of element coils 84A) into at least two units (unit 84-1, 84-2, . . . ) and having the control system (stage control system 68) change the element coils powered in units of such units, but the control system may also change the element coils powered in units of element coils.

Note that the embodiments explained above were given only to facilitate understanding of the present invention and were not given to limit the invention. Therefore, the elements disclosed in the above embodiments include all design modifications and equivalents falling within the technical scope of the present invention.

For example, in the above embodiments, the explanation was made of a step-and-scan type reduction projection exposure apparatus, but the present invention may similarly be applied to a step-and-repeat type reduction projection exposure apparatus (stepper) which emits exposure illumination light to the entire surface of the reticle pattern in the state with the reticle and wafer held stationary so as to expose at one time one shot area on the wafer to which the reticle pattern is to be transferred and further to a mirror projection type or proximity type or contact type or other type exposure apparatus.

Further, the present invention may be applied to a step-and-scan type reduction projection exposure apparatus using distant ultraviolet light or vacuum ultraviolet light etc. as the exposure light. In this exposure apparatus, the circuit pattern to be formed on the substrate (for example, reticle substrate) is enlarged by the inverse magnification of the reduction magnification, the enlarged pattern is divided into sections to form reticles, and the patterns of the reticles are reduced and projected to be transferred connected to each other on the substrate. When transferring the patterns of the reticles on the substrate, it is possible to use either of the scanning exposure system and the stationary exposure system. Further, there do not have to be any connecting parts between the patterns transferred adjoining each other on the substrate. That is, the step-and-switch method transfers patterns of reticles on exposure areas partially overlapping each other on the substrate without regard to the presence of connecting parts of patterns.

Further, the present invention may be applied to not only an exposure apparatus used for the production of a semiconductor element, liquid crystal display, plasma display, thin film magnetic head, and imaging element (CCD etc.), but also an exposure apparatus for transferring a circuit pattern to a glass substrate or silicon wafer etc. to produce a reticle or mask. That is, the present invention may be applied without regard as to the exposure system, application, etc. of the exposure apparatus.

The exposure apparatus to which the present invention is applied is not particularly limited. It is possible to use g-rays (wavelength 436 nm), i-rays (wavelength 365 nm), a KrF excimer laser (wavelength 248 nm), ArF excimer laser (wavelength 193 nm), $F_2$ laser (wavelength 157 nm), $Kr_2$ laser (wavelength 146 nm), KrAr laser (wavelength 134 nm), $Ar_2$ laser (wavelength 126 nm), etc.

Further, it is possible to use the high harmonic obtained by amplifying the infrared region or visible region single wavelength laser emitted from a DFB semiconductor laser or fiber laser by means of an erbium- (or erbium- and yttrium-) doped fiber amplifier and converting the wavelength to ultraviolet light by means of non-linear optical crystal. Further, as the single wavelength laser, it is possible to use a yttrium doped fiber laser. The present invention may also be applied to a reduction projection exposure apparatus using soft X-rays of a wavelength of around 10 nm as a light source, an X-ray exposure apparatus using a wavelength of around 1 nm as a light source, an exposure apparatus using an EB (electron beam) or ion beam, etc. When using an electron beam, as the electron gun, it is possible to use thermocouple radiation type lanthanum hexaboride ($LaB_6$) or tantalum (Ta). When using an electron beam, it is also possible to use a mask or form a pattern directly on the substrate without using a mask.

When using an excimer laser or other distant ultraviolet light, quartz, fluorite, or another material transmitting distant ultraviolet light is used as the glass of the projection optical system etc. When using an $F_2$ laser or X-rays, a reflection and refraction type or a refraction type optical system is used (a reflection type reticle is also used). Further, when using an electron beam, an electron optical system comprised of electron lenses and deflectors may be used. Further, the path over which the electron beam passes may of course be made a vacuum.

The magnification of the projection optical system of the exposure apparatus in which a linear motor of the present invention is used as a drive means may be not only reduction, but also equal magnification and enlargement. When using the linear motor of the present invention for a wafer stage or reticle stage, it is also possible to use an air floating type using an air bearing or a magnetic floating type using a reactance force. The stage to which the linear motor of the present invention is applied is not limited to a type moving along with a guide and may also be a guideless type not requiring a guide.

Further, the reaction force generated by the movement of the wafer stage may be released mechanically to the floor (ground) using a frame member utilizing the invention proposed in Japanese Unexamined Patent Publication (Kokai) No. 8-166475. Further, the reaction force generated by movement of the reticle stage may be released mechanically to the floor (ground) using a frame member utilizing the invention proposed in Japanese Unexamined Patent Publication (Kokai) No. 8-330224.

The exposure apparatus using the linear motor of the present invention explained above is produced by assembling the various subsystems including the components listed in the claims in a manner maintaining a predetermined mechanical accuracy, electrical accuracy, and optical accuracy.

To secure the various accuracies, before and after assembly, the various optical systems are adjusted to achieve optical accuracy, the various mechanical systems are adjusted to achieve mechanical accuracy, and the various electrical systems are adjusted to achieve electrical accuracy.

The process of assembly of the various subsystems into an exposure apparatus include mechanical connection among the various subsystems, connection of wiring of the electrical circuits, connection of piping of the pressure circuit, etc. Before the process of assembly of the subsystems to the exposure apparatus, there is of course the process of assembling the individual subsystems. After the assembly of the various subsystems into the exposure apparatus is finished, the apparatus as a whole is adjusted to secure the various accuracies of the exposure apparatus as a whole. Further, it is desirable to produce the exposure apparatus in a clean room controlled in temperature and cleanliness.

According to the present invention explained above, the advantages listed below may be obtained:

Since the linear motor device is provided with a stator provided with a coil unit having a coils, a movable member provided with a magnet unit having magnets, a current control system for supplying current to the coils, switches provided between the current control system and coils, and a switch control means for controlling the switches in accordance with the position of the movable member, it is possible to interrupt the current to the coils not involved in the movement of the movable member, possible to hold down the amount of power consumption and prevent generation of excess heat, and possible to improve the motor constant.

Since the switches connected to the coils are controlled in on/off state in accordance with the number of magnetic poles of the magnet unit arranged at the movable member side, it is possible to selectively supply current to the coils generating thrust together with the magnets on the movable member side, keep down the power consumption of the linear motor device, and improve the motor constant.

Since the switch control means controls the switches so that current is supplied to at least one coil facing the magnet unit, it is possible to generate a thrust with the magnets of the movable member side by the supply of current to the minimum necessary number of coils. As a result, it is possible to keep down the power consumption, prevent the excess generation of heat, and improve the motor constant.

Since the linear motor device is a linear motor device which has a stator provided with a coil unit having coils and a movable member provided with a magnet unit having magnets, which has the coils divided into at least two groups of coils and has at least two phases of current supplied for drive corresponding to the groups of coils, and which has the number of coils facing the magnet unit changing in accordance with the position of the movable member for each group of coils, where the switch control means controls switches provided between the current control system and coils so that current is supplied to the changing minimum number of coils plus "1" among the coils belonging to the groups of coils and where further the switch is controlled to turn on/off so that current is supplied to the number of coils facing the magnet unit and one coil adjoining them for the group of coils where the number of facing coils is the smallest, the coils generating thrust with the magnets can be powered and the number of coils powered in each group of coils can be made the minimum necessary number. As a result, the motor constant is raised.

Since the linear motor device is a linear motor device which has a stator provided with a coil unit having coils and a movable member provided with a magnet unit having magnets, which has the coils divided into at least two group of coilss and has at least two phases of current supplied for drive corresponding to the groups of coils, and which has the number of coils facing the magnet unit changing in accordance with the position of the movable member for each group of coils, where the switch control means controls switches provided between the current controller and coils so that current is supplied to the changing minimum number of coils plus "2" among the coils belonging to the group of coilss and where further the switch is controlled to turn on/off so that current is supplied to the number of coils facing the magnet unit and two coils adjoining them for the group of coils where the number of facing coils is the smallest, the coils generating thrust with the magnets are powered and the number of coils powered in each group of coils may be made the minimum necessary number. As a result, the motor constant is raised.

Since the linear motor device has the switches arranged between the at least two coils connected in parallel or in series and the current control system and therefore two or more coils are powered/broken by a single switch, it is possible to reduce the wires of the input side for supplying current to the coils in the stator. Due to this, the water-tightness of the housing is improved and the cooling efficiency of the linear motor device is raised.

Since the coils positioned at a predetermined area of the stator of the linear motor device is electrically connected to the current controller at all times, the number of wires led out from the housing can be reduced and the water-tightness of the housing can be improved and therefore the cooling efficiency of the linear motor device raised.

The stage device of the present invention uses the linear motor device of the present invention as the means for driving the stage unit, so the stage unit as a whole can be made higher in function commensurate with the increase of the motor constant of the linear motor device.

The exposure apparatus of the present invention for forming a predetermined pattern on a substrate using an exposure optical system is provided with the stage device of the present invention, so the exposure apparatus as a whole can be made higher in function by the amount of increase of the motor constant of the linear motor device.

If the exposure apparatus of the present invention is used to produce a device formed with a predetermined pattern, it becomes possible to produce a device with an efficiency increased by the amount of increase of the motor constant of the linear motor device.

The method of driving a linear motor of the present invention is a method of driving a linear motor having a stator provided with a coil unit having coils and a movable member provided with a magnet unit having magnets, where coils for supplying current are selected from among the coils in accordance with the position of the movable member, so excess consumption of power and generation of heat can be suppressed and the motor constant of the linear motor can be raised.

If driving a linear motor used as a means for driving a stage device using the method of driving a linear motor of the present invention, the performance of the stage device as a whole can be raised by the amount of increase of the motor constant of the linear motor. The exposure method of the present invention is an exposure method forming a predetermined pattern on a substrate placed on a stage device where the method of driving a stage device of the present invention is used when driving the stage device, so the exposure apparatus which is driven can be made higher in function overall by the amount of increase of the motor constant of the linear motor.

If using the exposure method of the present invention to produce a device formed with a predetermined pattern, in the production of the device, it is possible to raise the efficiency by the amount of increase in the motor constant of the linear motor.

Further, when forming the element coils into units as explained above, since it is possible to supply current to only the units to be driven, the amount of heat generated can be kept extremely low. Since a large current can also be supplied only to specific units, a larger thrust can be obtained compared with a conventional stage device using an electromagnetic actuator. There is also the advantage that when part of the element coils are damaged, only those element coils or unit including those element coils need be replaced. A large linear motor can be easily fabricated just by successively arranging a number of units. When there is variation in resistance values in individual element coils, the variation is averaged by the unitization and the linear motor can be controlled with a better accuracy.

The present disclosure relates to the themes included in Japanese Patent Application No. 11-159247 filed on Jun. 7, 1999 and Japanese Patent Application No. 11-290254 filed on Oct. 11, 1999. All of those disclosures are clearly incorporated here by reference.

What is claimed is:

1. A linear motor device, comprising:
   a movable member having a magnet unit;
   a stator having multi-phase coils, and;
   a control system connected to said multi-phase coils to control said multi-phase coils based on a position of the movable member,
   wherein the number of powered coils of each phase of said multi-phase coils is the same; and
   said number of powered coils including at least one coil in addition to coils which face said magnetic unit from among said multi-phase coils.

2. The linear motor device as set forth in claim 1, wherein:
   said movable member includes a magnet unit having magnets and
   said control system includes a current controller for supplying current to said multi-phase coils, switches provided between said current controller and coils, and a switch control means for controlling said switches in accordance with the position of the movable member.

3. The linear motor device as set forth in claim 2, wherein said switch control means is designed to turn on a number of the switches which corresponds to a number of magnetic poles of the magnet unit.

4. The linear motor device as set forth in claim 3, wherein the switch control means is designed to control said switches so that current is supplied to at least one coil facing said magnet unit among said multi-phase coils.

5. The linear motor device as set forth in claim 2, wherein said switches are arranged between at least two coils connected in parallel or serially and said current controller and therefore at least two coils are connected or interrupted by the single switch.

6. The linear motor device as set forth in claim 1, wherein coils positioned at a predetermined area of the stator are electrically powered at all times by said current controller.

7. The linear motor device as set forth in claim 1, wherein:
   said control system includes a current controller for supplying current to said multi-phase coils, switches provided between said current controller and said multi-phase coils, and a switch control means for controlling said switches in accordance with the position of the movable member; and
   said switch control means is designed to control said switches so that current is supplied to a number of coils corresponding to a minimum number of the multi-phase coils facing said magnet unit plus one or two coils of each said phase.

8. The linear motor device as set forth in claim 1, wherein:
   said control system includes a current controller for supplying current to said multi-phase coils, switches provided between said current controller and said multi-phase coils, and a switch control means for controlling said switches in accordance with the position of the movable member;
   and said switch control means is designed to control the on/off states of the switches of the minimum number of the multi-phase coils facing said magnet unit.

9. The linear motor device as set forth in claim 1, wherein said control system energizes one or two coils in addition to the coils which face said magnetic unit.

10. The linear motor device as set forth in claim 1, wherein said stator comprises three-phase coils.

11. A stage device having a stage, comprising:
    a linear motor device provided with a movable member having a magnet unit and a stator having multi-phase coils to move the stage; and
    a control system connected to said multi-phase coils to control said multi-phase coils based on a position of the movable member,
    wherein the number of powered coils of each phase of said multi-phase coils is the same; and
    said number of powered coils including at least one coil in addition to coils which face said magnetic unit from among said multi-phase coils.

12. The stage device as set forth in claim 11, further comprising a position detection system for detecting a position of the stage, the control system selecting the coils to be powered based on a detection value of the position detection system.

13. The stage device as set forth in claim 12, wherein said position detection system is a laser interferometer.

14. The stage device as set forth in claim 11, wherein said multi-phase coils are flat coils.

15. The stage device as set forth in claim 11, wherein said stator has a passage through which a refrigerant is circulated to cool the multi-phase coils.

16. The stage device as set forth in claim 11, wherein said control system energizes one or two coils in addition to the coils which face said magnetic unit.

17. The stage device as set forth in claim 11, wherein said stator comprises three-phase coils.

18. An exposure apparatus for exposing a photosensitive substrate through a mask formed with a pattern, comprising:
    a stage device that holds at least one of the mask and the photosensitive substrate;
    a linear motor comprising movable member having a magnet unit and a stator having multi-phase coils to move the stage device; and
    a control system connected to said multi-phase coils to control said multi-phase coils based on a position of the movable member,
    wherein the number of powered coils of each phase of said multi-phase coils is the same; and
    said number of powered coils including at least one coil in addition to coils which face said magnetic unit from among said multi-phase coils.

19. The exposure apparatus as set forth in claim 18, wherein said control system energizes one or two coils in addition to the coils which face said magnetic unit.

20. The exposure apparatus as set forth in claim 18, wherein said stator comprises three-phase coils.

* * * * *